United States Patent
Reisiger

(10) Patent No.: US 8,912,582 B2
(45) Date of Patent: Dec. 16, 2014

(54) INTEGRATED CIRCUIT STRUCTURE AND METHOD FOR PROTECTION FROM DAMAGE TO GATE DIELECTRIC

(71) Applicant: Analog Devices, Inc., Norwood, MA (US)

(72) Inventor: Mark D. Reisiger, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/801,928

(22) Filed: Mar. 13, 2013

(65) Prior Publication Data

US 2014/0264520 A1    Sep. 18, 2014

(51) Int. Cl.
*H01L 27/12*    (2006.01)
*H01L 27/02*    (2006.01)

(52) U.S. Cl.
CPC ................................. *H01L 27/0288* (2013.01)
USPC ........................................... 257/288; 438/585

(58) Field of Classification Search
CPC ............ H01L 21/28211; H01L 27/112; H01L 27/11206; H01L 29/42368; H01L 29/4238; H01L 29/42384; H01L 29/7833
USPC ...................... 257/E29.255, E27.06, E21.409, 257/E27.016, E21.177, E21.24
See application file for complete search history.

(56) References Cited

U.S. PATENT DOCUMENTS

| | | | |
|---|---|---|---|
| 6,075,273 A * | 6/2000 | Liu ............................... | 257/392 |
| 6,940,751 B2 | 9/2005 | Peng et al. | |
| 7,402,855 B2 | 7/2008 | Kurjanowicz | |
| 2004/0108547 A1 * | 6/2004 | Venkatraman ................ | 257/335 |

OTHER PUBLICATIONS

US 6,294,421, 09/2001, Gonzalez et al. (withdrawn).
Shin et al., "Thin gate oxide damage due to plasma processing," Semicond. Sci. Technol., 1996, pp. 463-473, vol. 11, IOP Publishing Ltd.

* cited by examiner

*Primary Examiner* — Zandra Smith
*Assistant Examiner* — Paul Patton
(74) *Attorney, Agent, or Firm* — Knobbe, Martens, Olson & Bear LLP

(57) ABSTRACT

An integrated circuit device comprises a common-gated dual-oxide MOSFET including a protective device and a MOSFET. A common gate electrode serves as a gate electrode of the protective device and as a gate of the MOSFET. The protective device comprises a first gate dielectric having a first thickness over a first channel region and the MOSFET comprises a second gate dielectric thicker than the first gate dielectric over a second channel region. During a plasma process, a first current can flow through the first dielectric that is higher than a second current through the second dielectric.

29 Claims, 11 Drawing Sheets

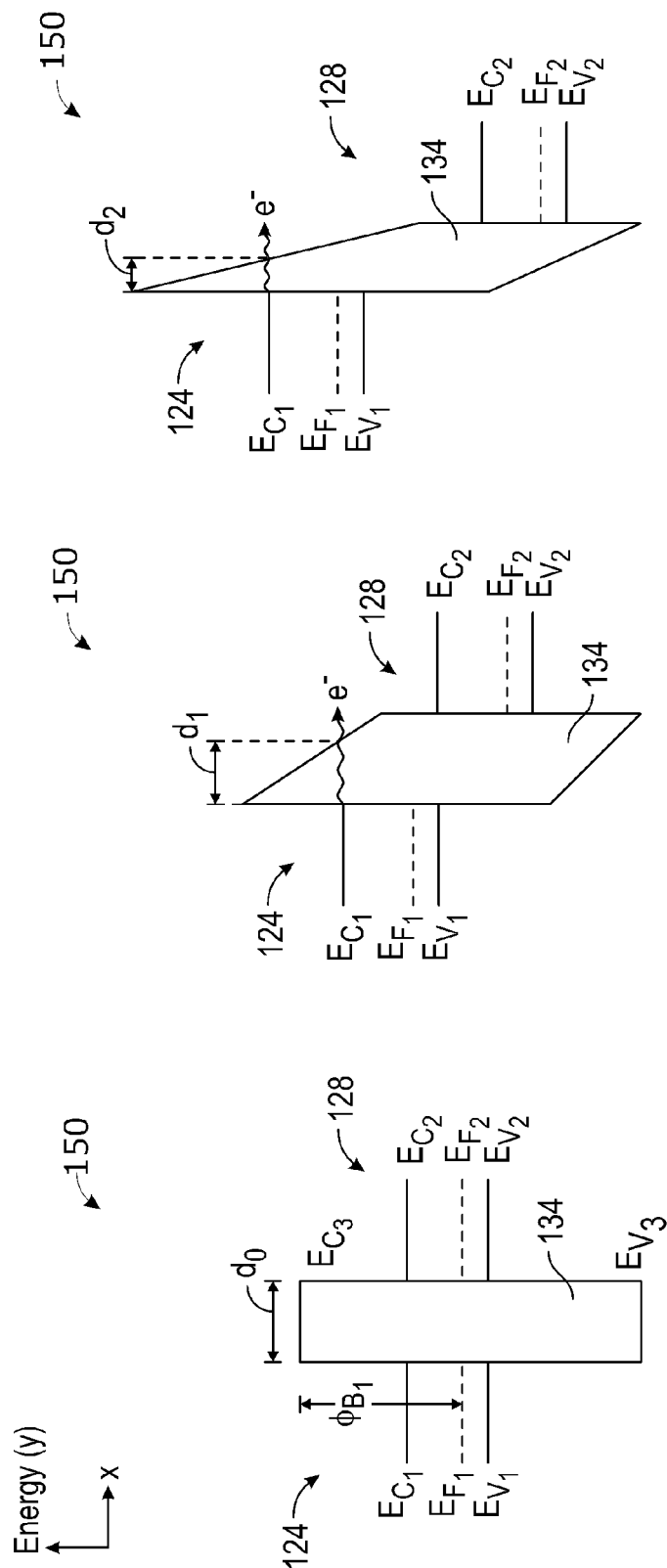

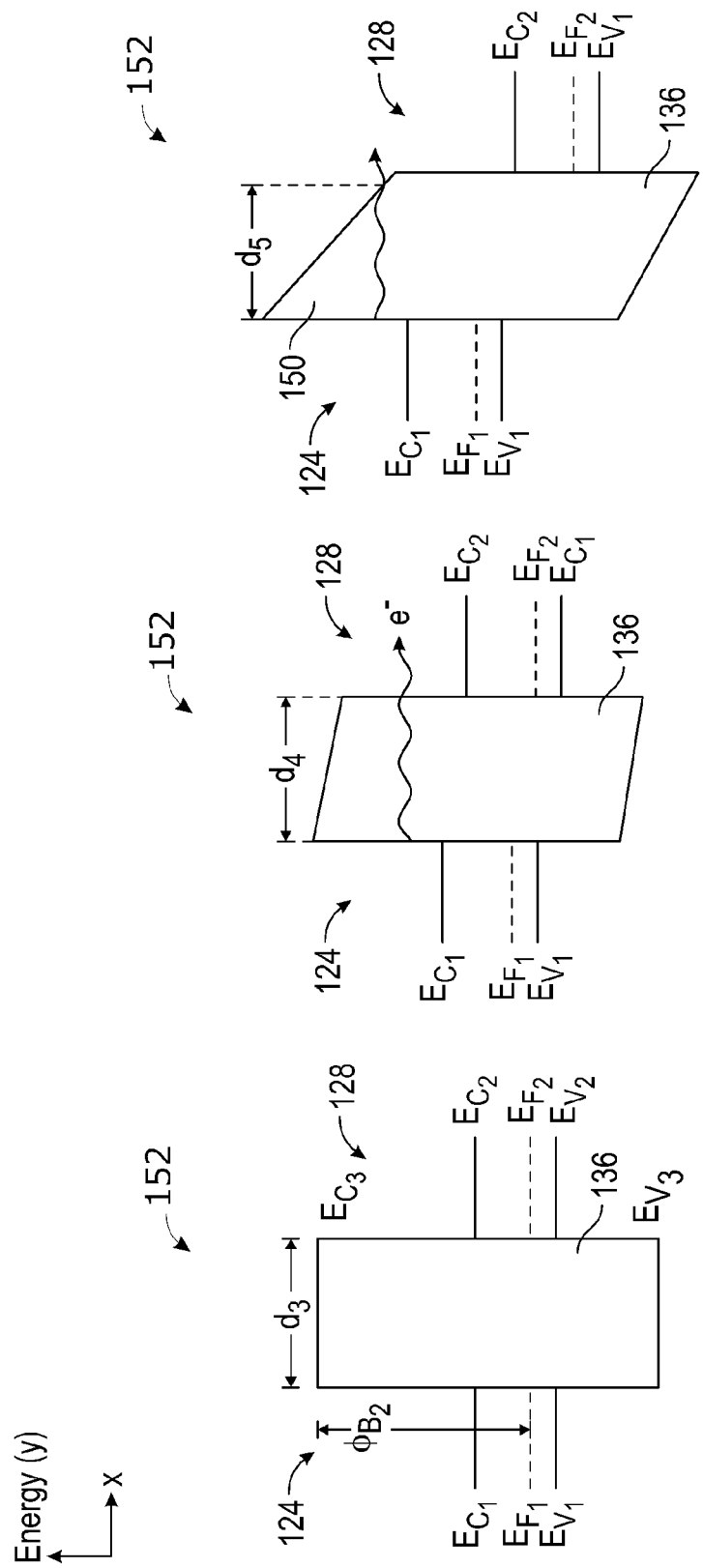

INTEGRATED CIRCUIT STRUCTURE AND METHOD FOR PROTECTION FROM DAMAGE TO GATE DIELECTRIC

FIELD

Embodiments of the invention relate to electronics, and more particularly, to methods and structures to protect gate dielectrics from damage from charge build-up and discharge, such as during plasma processing of semiconductors.

BACKGROUND

Electronic components such as integrated circuit devices may utilize various plasma processes. During a plasma process, certain conducting structures of partially fabricated integrated circuit devices may accumulate charge from the plasma. The accumulated charge can lead to a discharging event during processing, leading to high levels of current flowing through various current paths, for example, through diodes and gate dielectrics of transistors. Such discharging events can lead to performance and reliability degradation of the integrated circuit devices.

SUMMARY

In one embodiment, a common-gated dual-thickness dielectric MOSFET includes a protective device comprising a first gate dielectric having a first thickness and formed over a first channel region. The dual-thickness dielectric MOSFET additionally includes a MOSFET comprising a second gate dielectric thicker than the first gate dielectric and formed over a second channel region. The dual thickness dielectric further includes a common gate electrode serving as a gate electrode of the protective device and as a gate electrode of the MOSFET.

In another embodiment, a MOSFET coupled to a diode discharge path includes a first device region and a second device region formed on a semiconductor substrate. The MOSFET additionally includes a gate dielectric layer formed over the second device region and a common electrode formed over the first and second device regions. In this embodiment, the common electrode serves as a transistor gate electrode over the gate dielectric in the second device region. Also in this embodiment, the first device region provides a discharge path from the common electrode to the substrate. In addition, the discharge path has a lower resistance than a tunnel path through the gate dielectric layer over the second device region.

In yet another embodiment, a method of forming a common-gated dual-oxide MOSFET includes providing a semiconductor substrate, forming a first gate dielectric having a first thickness over a first channel region, forming a second gate dielectric thicker than the first gate dielectric over a second channel region, depositing a common gate electrode layer and masking the gate electrode layer, and plasma etching the masked gate electrode layer to form a common gate electrode over the first and second channel regions. The method additionally includes conducting a first current through the first gate dielectric and a second current through the second gate dielectric during plasma etching, where the first current is higher than the second current in absolute value.

BRIEF DESCRIPTION OF THE DRAWINGS

FIGS. 6A-6C are schematic illustrations of electronic energy band diagrams of a thin tunnel barrier capacitor under various voltage conditions according to one embodiment.

FIGS. 6D-6F are schematic illustrations of electronic energy band diagrams of a thick tunnel barrier capacitor under various voltage conditions according to another embodiment.

DETAILED DESCRIPTION OF THE PREFERRED EMBODIMENT

Figure 1:
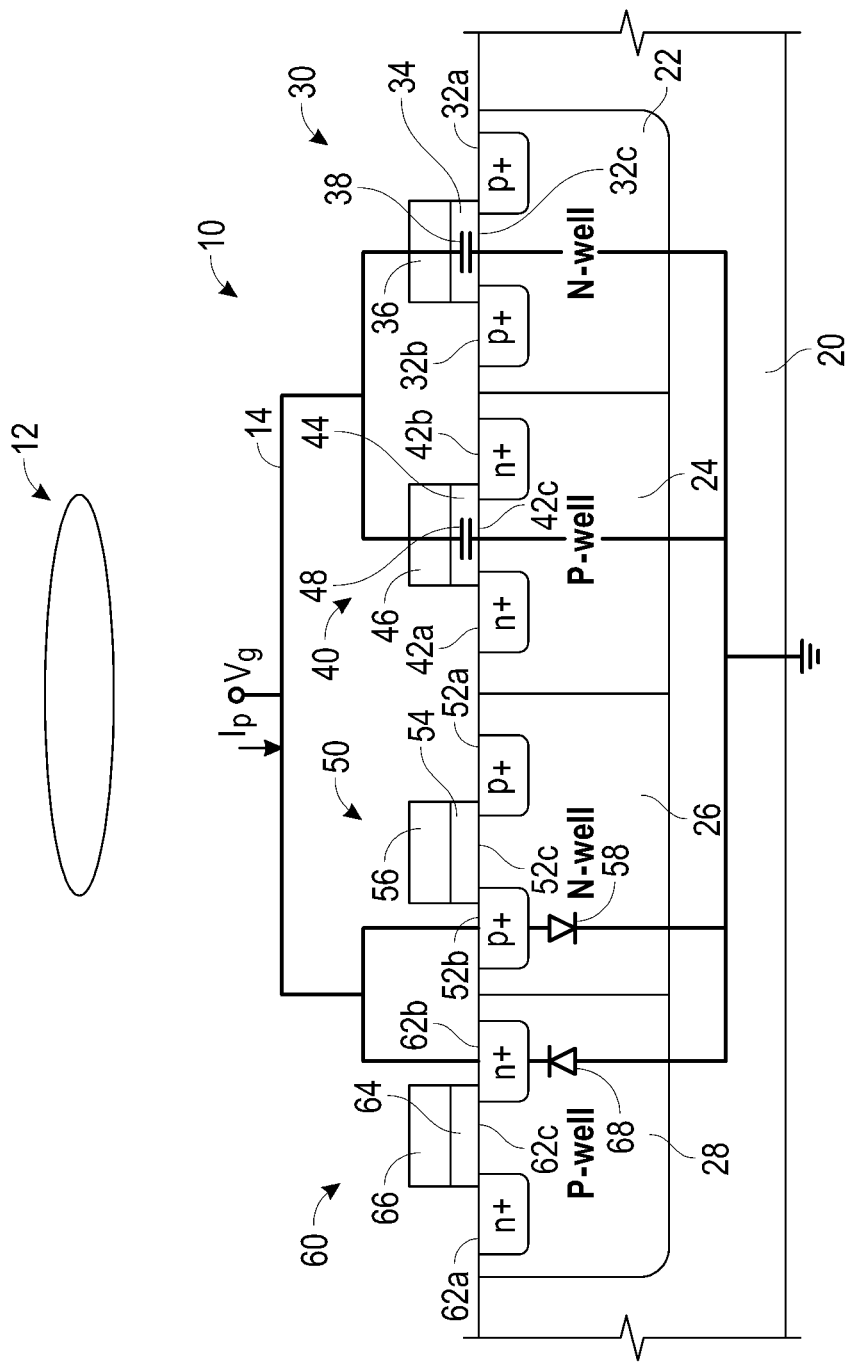
FIG. 1 is a cross-sectional view of a portion of an integrated circuit including protection diodes to protect against damage from charge build-up and discharge.

Plasma is a fully or partially ionized gas which includes positively-charged species and negatively-charged species, such as ions and electrons, in addition to neutral species. Plasma can be produced by coupling power to a gas in a number of ways. For example, an alternating electric field can be applied between two electrodes at radio frequencies (RF). Under suitable pressure conditions, a gas between the electrodes can cause charged species to accelerate in alternating directions, thereby causing collisions with molecules of the gas, causing ionization of the gas molecules and additional charged species that will be accelerated by the alternating filed. The process continues until sustainable plasma is formed, typically characterized by a glow discharge. Other means for coupling power to gas for generating active species including microwave remote plasma systems; inductively coupled plasma (ICP) systems; ultraviolet (UV) activation; electron cyclotron resonance (ECR) plasma systems; etc.

Many semiconductor manufacturing processes utilize plasma or otherwise activated chemical species, which tend to generate radicals, including charged species. Plasma processes used in semiconductor manufacturing include deposition processes, etch processes, and cleaning processes, among others. For instance, plasma-enhanced deposition processes used in semiconductor manufacturing include plasma-enhanced chemical vapor deposition (PECVD), high-density plasma chemical vapor deposition (HDPCVD), physical vapor deposition (PVD), and plasma enhanced atomic layer deposition (PEALD), among others. In some plasma-assisted deposition processes, such as PECVD of dielectrics, such as may be used for interlayer dielectric deposition after transistor gate formation, by using either radio frequency power or DC power to transfer the energy to increase the reactivity of the reactant gases, a lower deposition temperature may be achieved compared to comparable deposition processes that rely on thermal dissociation of reactants, such as low pressure chemical vapor deposition (LPCVD). In other plasma-assisted deposition processes, such as HDPCVD, which may be used for interlayer dielectric deposition that require filling a high aspect ratio gap between a gate and a source/drain contact, by applying a bias power to the substrate to impart directionality to reactant species, gaps having high aspect ratios can be filled, such as trenches and vias. In yet other plasma-assisted deposition processes, such as physical vapor deposition process, ions are accelerated towards a target having appropriate chemical composition to physically release clusters of atoms from the target, which are deposited onto a substrate.

Plasma-enhanced etch processes used in semiconductor manufacturing include downstream plasma etching, sputter etching, reactive ion etching (ME), magnetic enhanced ME, electron cyclotron resonance plasma etch (ECR plasma etch), and inductively coupled plasma etch, among others. Plasma-enhanced etch processes utilize varying degrees of physical bombardment and chemical reactivity of the etchant species to customize the process. In some plasma-assisted etch processes, such as sputter etching and ME, biasing the substrate or the support on which it is held causes the substrate to be subjected to directional ion bombardment, which enhances the directionality of the etch process. In other plasma-assisted etch processes, such as ECR and ICP plasma etches, isotropic etches can be achieved with the enhancement of energized chemical species.

During plasma processes, a semiconductor substrate including partially fabricated device structures are either directly or indirectly exposed to the plasma, thereby causing damage to the device structures. For example, as MOS transistors continue to scale in size, gate dielectrics become more prone to plasma damage. Degradation of gate dielectrics in MOS devices during plasma etching of gate materials can be caused by collection charged species by gate electrodes or metallization structures connected to the gate electrodes. Under this situation, the gate electrode or the metallization structures serve as "antennas" that collect a conduction current from the plasma.

For example, during RF (radio frequency) plasma processes, a substrate collects conduction current density $J_p$, which is a sum of ion current density J, and electron current density $J_e$, from the plasma according to the Langmuir theory readily recognized by a person skilled in the art, expressed as $$J_p = J_i + J_e = 0.6 \ en_i u_B - \frac{1}{4} en_e u_e \exp\left(-\frac{e(v_p(t) - V_g)}{kT_e}\right), \quad [1]$$

where e is the electronic charge, $n_i$ is the ion density, $u_B=(eT_e)^{1/2}/M$ is the Bohm velocity, M is the ion mass, $u_e$ is the electron mean thermal velocity, $n_e$ is the electron density, $v_p(t)=V_0+V_1 \sin(wt)$ is the self-generated plasma potential typically with frequency of 13.56 MHz, $T_e$ is the electron temperature, and $V_g$ is the gate (antenna) potential. Gate charging results when the $J_i$ and $J_e$ do not cancel each other with successive cycles of the RF plasma and leads to a steady increase or decrease of the $V_g$. When an absolute value of $V_g$ increases above a certain critical value, a current passes through the gate dielectric, such as through Fowler-Norheim tunneling, causing damage the gate dielectric of the MOS transistor.

The passage of the current through the gate dielectric can cause a damaging discharge event to the gate dielectric. In some circumstances, the damaging discharging event can cause a hard breakdown of the gate dielectric, rendering the MOS transistor non-functional. In other circumstances, the damaging discharging event can cause the gate dielectrics to undergo a soft breakdown, during which event charge may be trapped in the oxide. In yet other circumstances, the damaging discharging event can weaken atomic bonds at the dielectric-semiconductor interface, causing charge build-up during subsequent operations. Such damaged dielectrics may cause yield loss from shifts in threshold voltage, degradation of sub-threshold slope, and mobility degradation of the MOS transistors. Damaged gate dielectrics may also cause other reliability issues, such as hot-carrier induced degradation and time-dependent dielectric breakdown (TDDB).

FIG. 1 illustrates a cross sectional view of a portion of an integrated circuit including protection diodes. FIG. 1 illustrates a dual diode protection circuit 10 undergoing a plasma process such as plasma etching an interlayer dielectric (ILD) (not shown) formed over transistor structures. The dual diode protection circuit 10 is exposed to a plasma 12 and includes a substrate 20, a first p-channel metal-oxide-semiconductor field effect transistor (PMOSFET) 30 formed in a first n-well 22, a first n-channel metal-oxide-semiconductor field effect transistor (NMOSFET) 40 formed in a first p-well 24, a second PMOSFET 50 formed in a second n-well 26, and a second NMOSFET 60 formed in a second p-well 28. The first PMOSFET 30 includes a first p+ source region 32a, a first p+ drain region 32b, a first PMOSFET channel region 32c, a first PMOSFET gate dielectric 34, and a first PMOSFET gate 36. The first NMOSFET 40 includes a first n+ source region 42a, a first n+ drain region 42b, a first NMOSFET channel region 42c, a first NMOSFET gate dielectric 44, and a first NMOSFET gate 46. The second PMOSFET 50 includes a second p+ source region 52a, a second p+ drain region 52b, a second PMOSFET channel region 52c, a second PMOSFET gate dielectric 54, and a second PMOSFET gate 56. The second NMOSFET 60 includes a second n+ source region 62a, a second n+ drain region 62b, a second NMOSFET channel region 62c, a second NMOSFET gate dielectric 64, and a second NMOSFET gate 66.

The dual diode protection circuit 10 in FIG. 1 is annotated with relevant circuit elements that provide protection to the first partially fabricated PMOSFET 30 and the first NMOSFET during a plasma process. In particular, a first PMOSFET capacitor 38 is formed by the first PMOSFET gate electrode 36 and the first PMOSFET channel region 32c serving as first upper and lower electrodes. Additionally, a first NMOSFET capacitor 48 is formed by the first NMOSFET gate electrode 46 and the first NMOSFET channel region 42c serve as second upper and lower electrodes. The first and second upper electrodes of the first PMOSFET capacitor 38 and the first NMOSFET capacitor 48 may be connected to a common antenna 14, which may include a portion of an upper level metallization layer. During plasma processing, the first and second upper electrodes of the first PMOSFET capacitor 38 and the first NMOSFET capacitor 48 may be at $V_g$, as described above in connection with equation [1]. Additionally, during plasma processing, the first and second lower electrodes of the first PMOSFET capacitor 38 and the first NMOSFET capacitor 48 may be connected to a common ground through the first n-well 22 connected to the substrate 20 and the first p-well 22 connected to the substrate 20, respectively.

Without further connections, the first PMOSFET gate dielectric 34 and the first NMOSFET gate dielectric 44 can serve as current paths through which charge built-up in the first and second upper electrodes of the first PMOSFET capacitor 38 and the first NMOSFET capacitor 48 can discharge when their potential Vg exceeds a certain critical threshold limit, causing a discharge event. Such a discharge event can cause damage to the first PMOSFET gate dielectric 34 and the first NMOSFET gate dielectric 44, as discussed above. To prevent such an event, in the dual diode protection circuit 10 of FIG. 1, the first and second upper electrodes of the first PMOSFET capacitor 38 and the first NMOSFET capacitor 48 are connected to the second p+ drain region 52b of the second PMOSFET 50 and to the second n+ drain region 62b of the second NMOSFET 60, respectively, through the common antenna 14. The second p+ drain region 52b of the second PMOSFET 50 is connected to the second n-well 26 to form a first protection diode 58. Additionally, the second n+ drain region 62b of the second NMOSFET 60 is connected to the second p-well 28 to form a second protection diode 68. The second n-well 26 and the second p-well 28 are in turn connected to a common ground through the substrate 20. As illustrated, in response to either a positive or a negative changing event to which the antenna 14 may be subject, the first and second protection diodes 58 and 68 have opposite polarities such that for each polarity of charging, one of the first or second protection diodes 58 or 68 is forward biased to act as a current shunt path, providing protection to the first PMOSFET gate dielectric 34 and the first NMOSFET gate dielectric 44.

In the example of the dual protection diode circuit 10 of FIG. 1, the protection of the first PMOSFET gate dielectric 34 and the first NMOSFET gate dielectric 44 during plasma processing is provided through the second p+ drain region 52b of the second PMOSFET 50 and through the second n+ drain region 62b of the second NMOSFET 60, which serve as p and n regions of first and second protection diodes, respectively. Such circuits are useful in protecting against damage to MOSFETs during later fabrication processes, and may be employed in combination with the embodiments described herein. However, such circuits do not protect the gate dielectrics prior to the formation of source and drain regions, for example during the gate etch. During a typical transistor fabrication flow, the source and drain regions are formed subsequent to a gate etch process in a "self-aligned" manner, i.e., using the patterned gate itself as a mask to implant dopants into the source and drain regions. As a result, a damaging discharge event can occur prior to the formation of the diode elements described above for the dual diode protection circuit 10. Thus, there is a need for alternate means to protect the gate dielectrics of partially fabricated transistors during plasma processing.

Figure 2A:
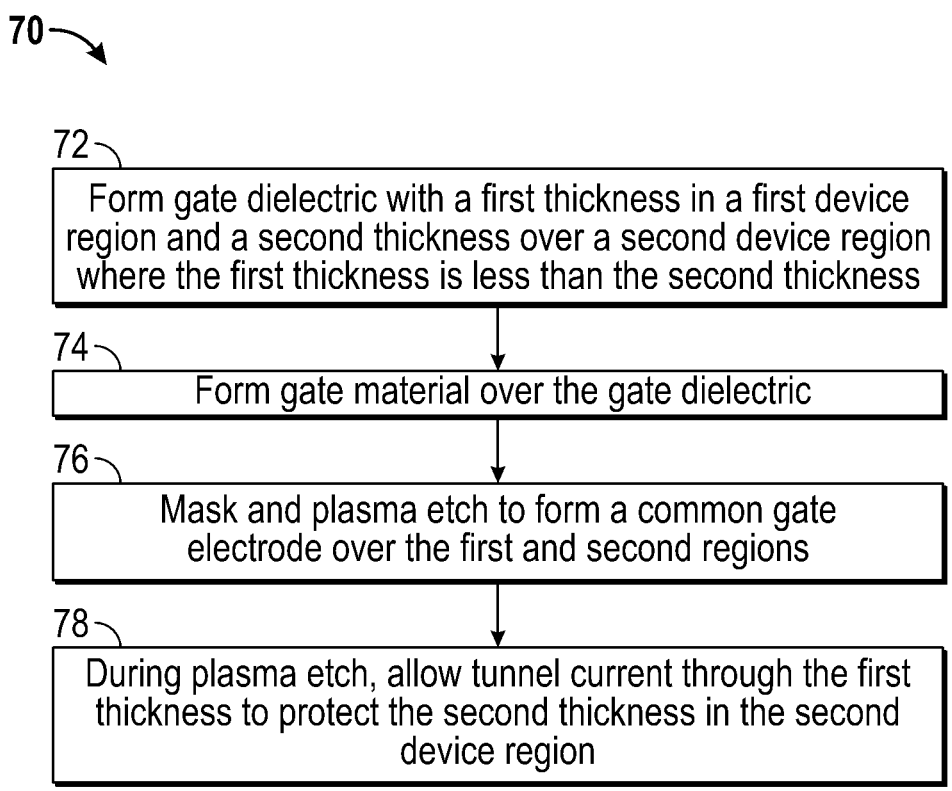
FIG. 2A is a process flow for fabricating a gate stack of a MOSFET coupled to a tunnel barrier discharge path according to one embodiment.

FIG. 2A illustrates a process flow 70 for fabricating an integrated circuit. The method includes forming 72 a gate dielectric over a substrate. The gate dielectric includes a first thickness in a first device region and a second thickness in a second device region, where the first thickness is less than the second thickness. A gate material is then deposited 74 over the gate dielectric. The gate material is then masked and plasma etched 76 to form a common gate electrode over the first and second device regions. During the plasma etch 76, charge build up in the gate material is allowed to diffuse out by tunneling 78 through the first thickness of the gate dielectric. Because of this current path to the substrate, the second thickness, in the second device region, is protected against damage by the current. As explained below in more detail, the transistor device formed (or partially formed) in first device region can serve as a dummy device that operates only during fabrication as protective device, whereas the transistor device formed in the second region, which is protected against current flow through its gate dielectric during fabrication, is an operational transistor in the final product.

Figure 2B:
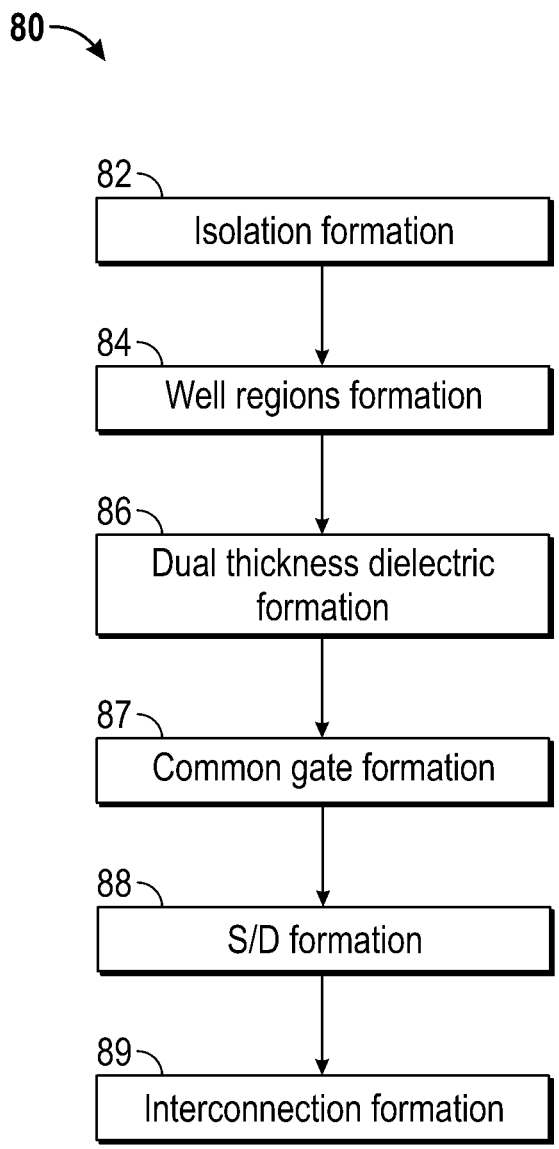
FIG. 2B a process flow for fabricating a MOSFET coupled to a tunnel barrier discharge path according to one embodiment.

Referring to FIG. 2B, a process flow 80 for fabricating a MOSFET coupled to a tunnel barrier discharge path is described. The process flow includes forming field isolation 82, forming well regions 84, forming a dual-thickness dielectric 86, forming a common gate and source/drain 88, and forming interconnections 89. The following descriptions of various processes are meant to demonstrate example process steps, and some of the process steps may be replaced by a similar steps in some implementations or omitted in other implementations. In yet other implementations, the sequence of some process steps may be interchanged with other process steps and still achieve substantially the same end result.

Forming the isolation 82 according to one implementation may include a sacrificial oxide growth process and a hard mask process. Prior to forming isolation 82, epitaxial semiconductor layers may be grown on a semiconductor substrate such as a silicon substrate. The sacrificial oxide growth process forms a sacrificial oxide on the epitaxial semiconductor, which may be replaced by a gate oxide later in the process flow. The sacrificial oxide growth may employ any suitable oxide formation step such as a dry or a wet thermal oxidation process for silicon substrates. The hard mask may comprise, for example, silicon nitride, which can serve as a mask through which to form field isolation regions and may also function as an etch stop layer later in the process. The hard mask may serve, for example, as a mask for etching shallow trenches, which can be lined and filled with isolation material for shallow trench isolation (STI). Alternatively, the thermal oxidation can be employed to grow field isolation regions from the substrate through the hard mask. After forming the isolation regions 82, any hard mask employed, as wells as any underlying pad oxide, can be removed.

Forming well regions 84 may include forming n-well regions to define regions where PMOSFETs are to be built in the subsequent steps and forming a p-well regions to define regions where NMOSFETs are to be built in the subsequent steps. Wells of either type may be formed in regions with both dielectric thicknesses, as will be understood from description of the subsequent process block. Alternatively, wells may be formed only under regions with the thicker dielectric and no well formed under regions with the thinner dielectric.

Forming dual thicknesses of dielectric 86 according to one implementation may include a pre-clean process. The pre-clean process may remove the sacrificial oxide formed on the semiconductor substrate in the isolation formation step 82 as described above, using suitable chemicals such as dilute HF, for example. The pre-clean process may additionally include a contamination removal process employing, for example, a chemical solution including $H_2O$, $H_2O_2$, and $NH_4OH$. The contamination removal process may additionally or alternatively employ a chemical solution including $H_2O$, $H_2O_2$, and HCl. In some implementations, the pre-clean process may further include a hydrogen termination process following the contamination removal process.

Forming the dual thickness dielectric 86 can be conducted by growing the dielectric from the substrate, such as by thermal or chemical oxidation and/or surface nitridation. In such an embodiment, the process may include growing the oxide in two stages, whereby oxidation is performed once in the region where the thin dielectric is desired and twice in the region where the thick dielectric is desired. For example, an intermediate dielectric by masking the substrate and growing a thin layer of thermal oxide over the entire substrate, followed by regrowth through a mask or hard mask with openings only where the thicker oxide is desired. In the case of grown dielectric, the dielectric comprises $SiO_2$, with or without interfacial SiN and/or SiON (e.g., through nitridation).

The dual thickness dielectric layer can alternatively include any one of a suitable high dielectric constant (high K) materials such as $Si_3N_4$, $HfO_2$, $ZrO_2$, $Ta_2O_5$, $BaTiO_2$, $BaZrO_3$, $TiO_2$, $Al_2O_3$, $Y_2O_3$, $La_2O_3$, $ZrSiO_4$, and $LaAlO_3$, and combinations thereof, among others. Suitable high K films may be formed by deposition, e.g., ALD, PVD, and CVD, among other processes. $SiO_2$-based films can also be deposited. In the case of deposition, the two thicknesses can be deposited and patterned in independent processes; or can be differentiated in thickness additively (by two depositions where thick dielectric is desired and one deposition where the thinner dielectric is desired); or can be differentiated subtractively (by a single deposition and selective etch back for the regions where the thinner dielectric is desired).

The thicknesses for the dielectric will depend upon the desired application, and also depends upon the material(s) chosen for the dielectric. The thinner regions are selected to allow tunneling and thus discharge charge build-up on the gate electrode layer (to be formed over it) during plasma etching of the gate electrode layer. The thinner regions may have no function in the final product. The thicker regions of the dielectric serve as a gate dielectric for a MOSFET in the final product, and are thicker than the thinner regions such that a much smaller proportion current discharging from the gate electrode during plasma etching, if any, flows through the thicker portions of the dielectric.

In one embodiment, where the final transistor structure employing the thicker dielectric as a gate dielectric serves as a high-voltage transistor, and the dielectric is thermal oxide, the first thickness may be between about 5 nm and 10 nm, and more particularly between about 6 nm and 8 nm, for instance about 7 nm. For this embodiment, the second thickness may be between about 11 nm and 15 nm, more particularly between about 12 nm and 14 nm, for instance about 12.5 nm. In embodiments, the ratio of the second thickness to the first thickness may be between about 1.2 and 2.2, more particularly between about 1.5 and 2.0, for instance about 1.8.

Forming the common gate electrode 87 can include blanket depositing a gate material, particularly polycrystalline silicon ("polysilicon"), and subsequently patterning, where patterning includes masking and etching the gate material by plasma etch processes. The gate material may be in-situ doped (during deposition) or subsequently doped. During the plasma etch, charge accumulation in the gate material is allowed to discharge to the substrate through the thin portions of the gate dielectric. The patterning leaves a common gate electrode directly over both thick and thin dielectric portions. However, an integrated circuit can include multiple gate electrodes that are not in electrical communication with one another after patterning is conducted, or that are formed from separate depositions. At least one such gate electrode directly overlies both a thin portion and a thick portion of the dual thickness dielectric.

According to one implementation, where both PMOS and NMOS devices are to be fabricated on the substrate, forming the common gate electrode 87 may include forming a first common gate electrode over the n-well regions and a second common gate electrode over the p-well regions, each of which directly overlies thinner portions of the dual thickness dielectric and thicker portions.

Gate electrode patterning may be followed by a self-aligned source/drain (S/D) doping 88. For implementations including both PMOS and NMOS devices, separate doping steps can provide (e.g., implant) p-type dopants in PMOS device regions (with NMOS device regions masked) and n-type dopants in NMOS device regions (with PMOS device regions masked). The skilled artisan will appreciate that multiple doping steps may be employed for tailoring transistor functionality, such as halo doping, lightly doped drain (LDD) doping, etc., some of which can be conducted after a spacer process, as will be appreciated by the skilled artisan.

Formation of interconnects 89 according to one implementation completes the wafer processing prior to packaging and may include source/drain/gate self-aligned silicidation (also known as salicide); depositing a first interlayer dielectric; source/drain/gate contacting; and one or more levels of metal interconnect. The source/drain/gate silicidation may form a salicide such as a titanium silicide and a cobalt silicide in processes involving silicon-based gates. The salicides reduce the contact resistance between the source, drain, and gate regions and the subsequent contact metals, such as tungsten. Following the salicide formation process, a first interlayer dielectric layer may be formed over the entire substrate, followed by a source/drain/gate contact formation process including contact lithography and etch processes to pattern and etch contact vias to the underlying source regions, drain regions, and gate regions. Contacting the source/drain/gate may also include filling contact vias, such with as a tungsten via fill process, to make electrical contact to the underlying source, drain, and gate regions. Interconnect metallization can route to various contacts made to the underlying source, drain, and gate regions.

Figure 3A:
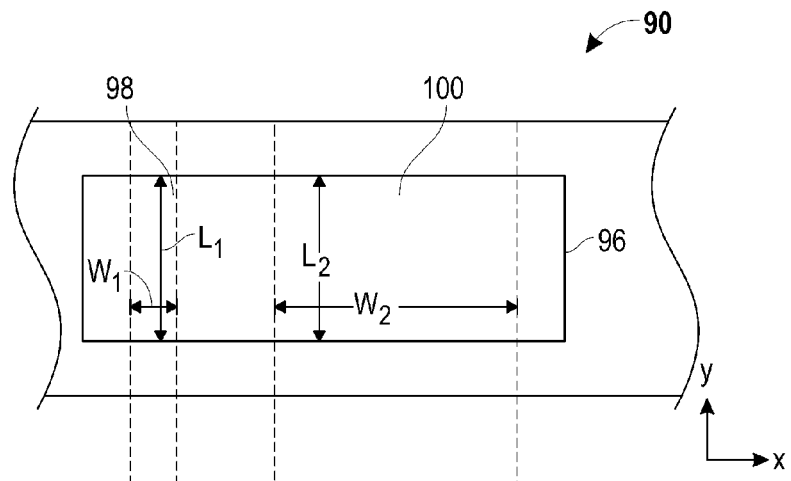
FIGS. 3A and 3B show a top down view and a cross-sectional view, respectively, of a partially fabricated MOSFET coupled to a tunnel barrier discharge path according to a embodiment.
Figure 3B:
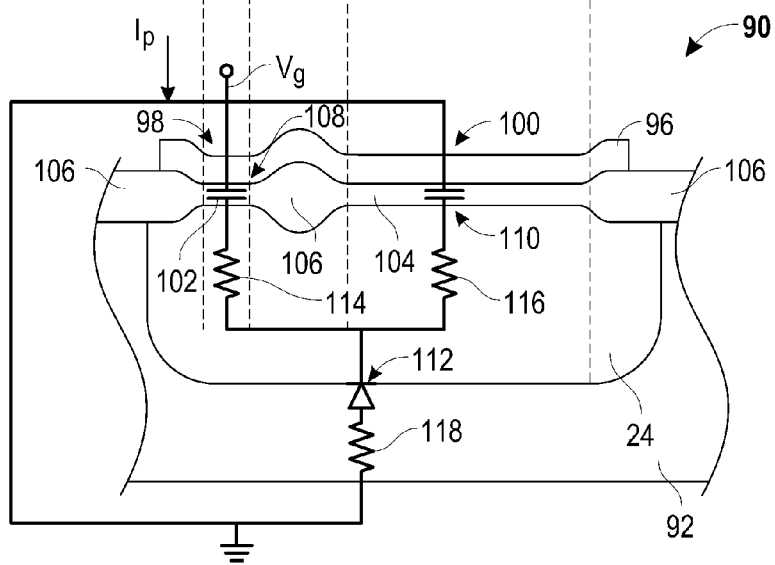

FIGS. 3A and 3B show a top down view and a cross-sectional view, respectively, of a partially fabricated MOSFET 90 coupled to a tunnel barrier discharge path according to one embodiment. The structure is shown after forming the common gate electrode 87 and prior to S/D doping 88 of FIG. 2B. The illustrated MOSFET 90 is a PMOS device and includes a p-type semiconductor substrate (P-SUB) 92, an n-well region 24 formed in the P-SUB 92, a first device region 98, a second device region 100, a tunnel dielectric layer 102 formed over the n-well region 94 in the first device region 98 and having a first thickness, a gate dielectric layer 104 formed over the n-well region 94 in the second device region 100 and having a second thickness greater than the first thickness, and a common electrode 96 formed in both device regions 98, 100, that is, over the tunnel dielectric layer 102 and over the gate dielectric layer 104. It will be understood in view of the discussion of FIGS. 4A and 4B below that the doped regions can have different conductivity types from those discussed above.

Referring to the top down view of the example implantation of the partially fabricated MOSFET 90 illustrated in FIG. 3A, the common electrode 96 has a rectangular form having first common electrode length in the y-direction and a first common electrode width in the x-direction. However, other implementations are possible, such as the common electrode 96 having a rectangular form with rounded corners or an elliptical form, among others, and the width may differ at different points along its length.

In the embodiment of FIG. 3A, the common electrode 96 overlaps the first and second device regions 98 and 100. The first device region 98 has a first rectangular area $A_1$ approximately defined by a first device width $W_1$ multiplied by a first device length $L_1$. The second device region 100 has a second rectangular area $A_2$ approximately defined by a second device width $W_2$ multiplied by a a second device length $L_2$.

In some implementations, $L_1$ has a dimension in the range of 0.1 µm to 3 µm, for example 2 µm. In other implementations, $L_1$ has a dimension in the range of 2 µm to 10 µm, for example 6 µm. In yet other implementations, $L_1$ has a dimension in the range of 10 µm to 50 µm, for example 20 µm.

In some implementations, $W_1$ has a dimension in the range of 0.1 µm to 0.3 µm, for example 0.2 µm. In other implementations, $W_1$ has a dimension in the range of 0.3 µm to 1.0 µm, for example 0.7 µm. In yet other implementations, $W_1$ has a dimension in the range of 1 µm to 5 µm, for example 3 µm.

In some implementations, $L_2$ has a dimension in the range of 0.1 µm to 3 µm, for example 2 µm. In other implementations, $L_1$ has a dimension in the range of 2 µm to 10 µm, for example 6 µm. In yet other implementations, $L_1$ has a dimension in the range of 10 µm to 50 µm, for example 20 µm.

In some implementations, $W_2$ has a dimension in the range of 1 µm to 20 µm, for example 10 µm. In other implementations, $W_2$ has a dimension in the range of 20 µm to 40 µm, for example 30 µm. In yet other implementations, $W_2$ has a dimension in the range of 40 µm to 100 µm, for example 70 µm.

Referring to FIG. 3B, the first device region 98 corresponds, horizontally in the plane parallel to the substrate surface, to the region approximately defined by the tunnel dielectric layer 102 and the second device region 100 corresponds, horizontally in the plane parallel to the substrate surface, to the region approximately defined by the gate dielectric layer 104. The tunnel dielectric layer 102 and the gate dielectric layer 104 are separated by field isolation 106. The common electrode 96 is shown directly overlying the tunnel dielectric layer 102 in the first device region 98 and the gate dielectric layer 104 in the second device region 100. The tunnel dielectric layer 102 represents a thinner portion of the dielectric on the substrate surface in the device regions, whereas the gate dielectric 110 represents a thicker portion of the dielectric in the device regions.

FIG. 3B, is annotated with relevant circuit elements for the illustrated PMOS implementation. The partially fabricated MOSFET 90 includes a first tunnel barrier capacitor 108 (across the tunnel dielectric 102), a second tunnel barrier capacitor 110 (across the gate dielectric 104), a PN diode 112, a first resistor 114, a second resistor 116, and a third resistor 118. The first tunnel barrier capacitor 108 comprises the tunnel dielectric layer 102 sandwiched between the common electrode 96 as an upper electrode and the n-well region 94 in the first device region 98 as a lower electrode. The second tunnel barrier capacitor 110 comprises the gate dielectric 104 sandwiched between the common electrode 96 as an upper electrode and the n-well region 94 in the second device region 100 as a lower electrode. The PN diode 112 is formed by a junction formed by the p-type semiconductor substrate 92 and the n-well region 94 forming a P-side and an N-side of the PN diode 112, respectively. When fully formed, n-well region 94 disposed below the tunnel dielectric layer 102 and the gate dielectric 104 may serve as first and second channel regions of a MOSFET. Furthermore, the common electrode 96 may be doped n-type to form a PMOSFET.

During plasma processing, the upper electrodes of the first tunnel barrier capacitor 108 and the second tunnel barrier capacitor 110 are formed by the common gate material being etched and therefore are electrically connected to each other and may be at a gate potential $V_g$, as described above in connection with equation [1]. The lower electrode of the first tunnel barrier capacitor 108 is electrically connected to the N-side of the PN diode 112 through the first resistor 114 formed in the n-well region 94 and the lower electrode of the second tunnel barrier capacitor 110 is electrically connected to the N-side of the PN diode 112 through the second resistor 116. The P-side of the PN diode 112 is connected to the p-type semiconductor substrate 92, which may be at a lower potential such as the ground potential of a wafer chuck of a plasma process tool. When the gate potential of the upper electrodes of the first tunnel barrier capacitor 108 and the second tunnel barrier capacitor 110 are at a Vg having a positive value through accumulation of a net positive charge as described in connection with equation [1], the PN diode 112 is reverse biased. On the other hand, when the gate material (upper electrodes of the first tunnel barrier capacitor 108 and the second tunnel barrier capacitor 110) is at a $V_g$ having a negative value through accumulation of net negative charge, the PN diode 112 is forward biased.

The result of the configuration in FIGS. 3A and 3B is that two current paths from the common gate electrode 96 at Vg to the p-type semiconductor substrate 92 at a lower ground potential exist during and after completion of the gate plasma etch process. A first current path is through the first tunnel capacitor 108, the first resistor 114, the PN diode 112, and the third resistor 118. A second current path is through the second tunnel capacitor 110, the second resistor 116, the first PN diode 112, and the fourth resistor 118. Because the first tunnel capacitor 108 is across the tunnel dielectric layer 102 that is substantially thinner than the gate dielectric layer 104 of the second tunnel barrier capacitor 110, the preferred current path is the first current path, thereby protecting the gate dielectric layer 104 during and after completion of the plasma gate etch process, as will be described more in detail in connection with FIGS. 6A-6F.

Figure 4A:
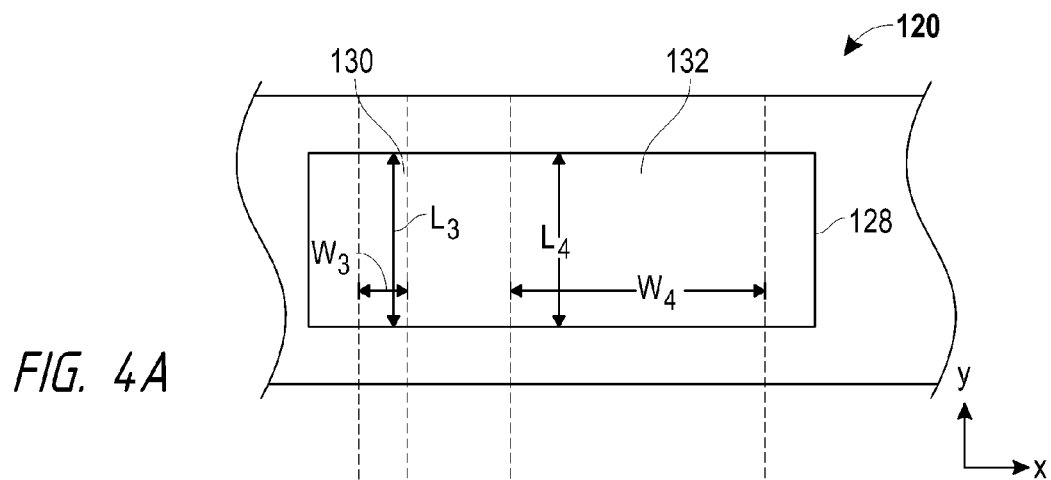
FIGS. 4A and 4B show a top down view and a cross-sectional view, respectively, of a partially fabricated MOSFET coupled to a tunnel barrier discharge path according to another embodiment.
Figure 4B:
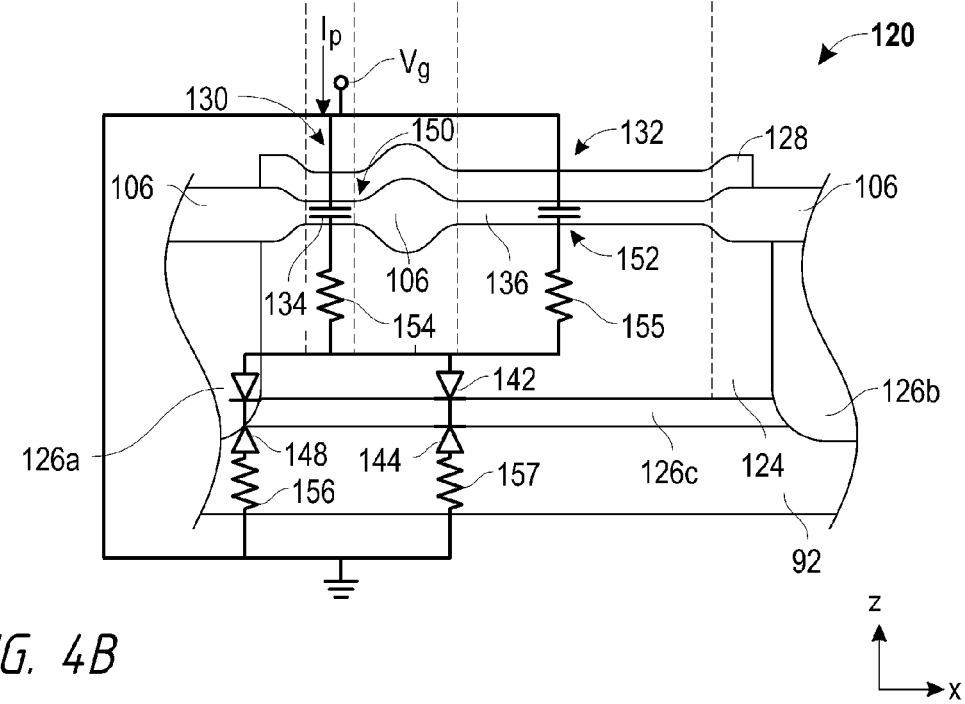

FIGS. 4A and 4B show a top down view and a cross-sectional view, respectively, of a partially fabricated MOSFET 120 coupled to a tunnel barrier discharge path according to another embodiment. The structure is shown after forming the common gate electrode 87 and prior to S/D doping 88 of FIG. 2B. The illustrated partially fabricated MOSFET 120 is an NMOS device and includes the p-type semiconductor substrate (P-SUB) 92, a p-well region 124 formed in the P-SUB 92, a first device region 130, a second device region 132, a tunnel dielectric layer 134 formed over the p-well region 124 in the first device region 130 and having a first thickness, a gate dielectric layer 136 formed over the first p-well region 124 in the fourth device region 132 and having a second thickness greater than the first thickness, and a common electrode 128 formed over the tunnel dielectric layer 134 and over the gate dielectric layer 136.

Referring to the top down view of the partially fabricated MOSFET 120 illustrated in FIG. 4A, similar to the common electrode 96 of FIG. 3A, the common electrode 128 has a rectangular form having a common electrode length in the y-direction and a common electrode width in the x-direction. Also similar to the common electrode 96 of FIG. 3A, other implementations are possible, such as the common electrode 128 having a rectangular form with rounded corners or an elliptical form, among others, and the width may differ at different points along its length.

In the embodiment of FIG. 4A, similar to the common electrode 96 of FIG. 3A, the common electrode 128 overlaps the first and second device regions 130, 132. The first device region 130 has a rectangular area $A_3$ approximately defined by a device width $W_3$ multiplied by a device length $L_3$. The second device region 132 has a rectangular area $A_4$ approximately defined by a device width $W_4$ multiplied by a device length $L_4$.

The dimensions the device width $W_3$, the device length $L_3$, the device width $W_4$, and the device length $L_4$ can be substantially similar to the corresponding dimensions $W_1$, $L_1$, $W_2$, $L_2$, as discussed above in connection with the first and second device regions 98 and 100 in FIG. 3A.

Referring to FIG. 4B, the first device region 130 corresponds, horizontally in the plane parallel to the substrate surface, to a region approximately defined by the tunnel dielectric layer 134 and the second device region 132 corresponds, horizontally in the plane parallel to the substrate surface, to a region approximately defined by the gate dielectric layer 136. The tunnel dielectric layer 134 in the first device region 130 and the gate dielectric layer 136 in the second device region 132 are separated in the x-direction by field isolation 106. The common electrode 128 is shown directly overlying the tunnel dielectric layer 134 in the first device region 130 and directly overlying the gate dielectric layer 136 in the second device region 132. The tunnel dielectric layer 134 represents a thinner portion of the dielectric on the substrate surface in the device regions, whereas the gate dielectric 136 represents a thicker portion of the dielectric in the device regions.

In addition, the partially fabricated MOSFET 120 coupled to a tunnel barrier discharge path may include an isolation n-well 126a on the first side of the p-well region 124 and an isolation n-well 126b on the second side of the p-well region 124. Although depicted herein as two wells, the isolation n-wells 126a and 126b may form a ring surrounding the p-well region. The structure can also include an n-type buried well 126c. When included, the isolation n-well 126a, the isolation n-well 126b, and the n-type buried well 126c form a continuous n-type tub isolation which surrounds the p-well region 124 to reduce current leakage from the p-well region 124 to the p-type semiconductor substrate 92 and to adjacent n-well regions.

FIG. 4B, is annotated with relevant circuit elements. The partially fabricated MOSFET 120 of FIG. 4B includes a first tunnel barrier capacitor 150, a second tunnel barrier capacitor 152, a first PN diode 142, a second PN diode 144, a third PN diode 146, a fourth PN diode 148, a first resistor 154, a second resistor 155, a third resistor 156, and a fourth resistor 157. The first tunnel barrier capacitor 150 comprises the tunnel dielectric layer 134 sandwiched between the common electrode 128 as an upper electrode and the p-well region 124 in the first device region 130 as a lower electrode. The second tunnel barrier capacitor 152 comprises the gate dielectric 136 sandwiched between the common electrode 128 as an upper electrode and the p-well region 124 in the second device region 132 as a lower electrode. The first PN diode 142 is formed by a junction formed by the p-well region 124 and the n-type buried well 126c forming the P-side and the N-side of the first PN diode 142, respectively. The second PN diode 144 is formed by a junction formed by the P-SUB 92 and the n-type buried well 126c forming the P-side and the N-side of the second PN diode 144, respectively. The third PN diode 146 is formed by a junction formed by the p-well region 124 and the isolation n-well 126a forming the P-side and the N-side of the third PN diode 146, respectively. The fourth PN diode 148 is formed by a junction formed by the P-SUB 92 and the isolation n-well 126a forming the P-side and the N-side of the fourth PN diode 148, respectively. When fully formed, p-well region 124 disposed below the tunnel dielectric layer 134 and the gate dielectric 136 may serve first and second channel regions of a MOSFET. Furthermore, the common electrode 128 may be doped p-type to form an NMOSFET.

During plasma processing, the upper electrodes of the first tunnel barrier capacitor 150 and the second tunnel barrier capacitor 152 are formed by the common gate material being etched and therefore are electrically connected to each other and are at a gate potential Vg, as described above in connection with equation [1]. The lower electrode of the first tunnel barrier capacitor 150 is electrically connected to the P-side of the fourth PN diode 146 through the first resistor 154 formed in the p-well region 124 and lower electrode of the second tunnel barrier capacitor 152 is electrically connected to the P-side of the first PN diode 142 through the second resistor 155 formed in the p-well region 124. The N-side of the third PN diode 146 is connected to the N-side of the fourth PN diode 148, and the P-side of fourth PN diode 148 is in turn connected to the third resistor 156 formed in the P-SUB 92, which may be at a lower potential such as a ground potential of the wafer chuck of a plasma process tool. Similarly, the N-side of the first PN diode 142 is in turn connected to the N-side of the second PN diode 144, and the P-side of second PN diode 144 is in turn connected to the fourth resistor 157 formed in the P-SUB 92, which may also be at a lower potential such as the ground potential of the wafer chuck of a plasma process tool. Under this configuration, the first PN diode 142 and the second PN diode 144 are connected at the N-sides in a back-to-back configuration and the third PN diode 146 and the fourth PN diode 148 are connected at the N-sides in a back-to-back configuration. When the potential of the upper electrodes of the first tunnel barrier capacitor 150 and the second tunnel barrier capacitor 152 is at a Vg having a positive value through accumulation of net positive charge as described in connection with equation [1], the second PN diode 144 and the fourth PN diode 148 are reverse biased and the first PN diode 142 and the third PN diode 146 are forward biased. On the other hand, when the gate material (upper electrodes of the first tunnel barrier capacitor 150 and the second tunnel barrier capacitor 152) is at a Vg having a negative value through accumulation of net negative charge as described in connection with equation [1], the second PN diode 144 and the fourth PN diode 148 are forward biased and the first PN diode 142 and the third PN diode 146 are reverse biased.

The result of the configuration in FIGS. 4A and 4B is that two current paths from the common gate electrode 128 at Vg to the p-type semiconductor substrate 92 exist during and after completion of the gate etch process. A first current path is through the first tunnel barrier capacitor 150, the first resistor 154, the third PN diode 146, and the fourth PN diode 148, and the second resistor 155. A second current path is through the second tunnel barrier capacitor 152, the second resistor 155, the first PN diode 142, the second PN diode 144, and the fourth resistor 157. Because the first tunnel barrier capacitor 150 is across the tunnel dielectric layer 134 that is substantially thinner than the gate dielectric layer 136 of the second tunnel barrier capacitor 152, the preferred current path is the first current path, thereby protecting the gate dielectric layer 136 during and after completion of the gate plasma etch process, as will be described more in detail in connection with FIGS. 6A-6F.

Figure 5A:
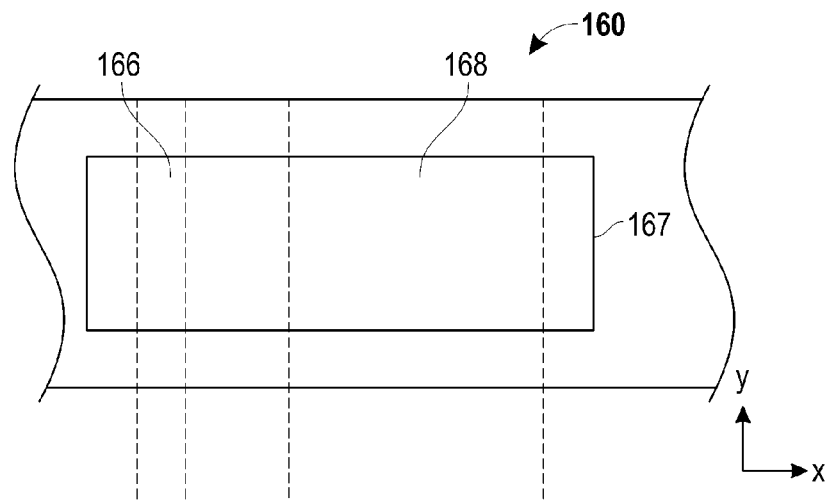
FIGS. 5A and 5B show a top down view and a cross-sectional view, respectively, of a partially fabricated MOSFET coupled to a diode discharge path according to yet another embodiment.
Figure 5B:
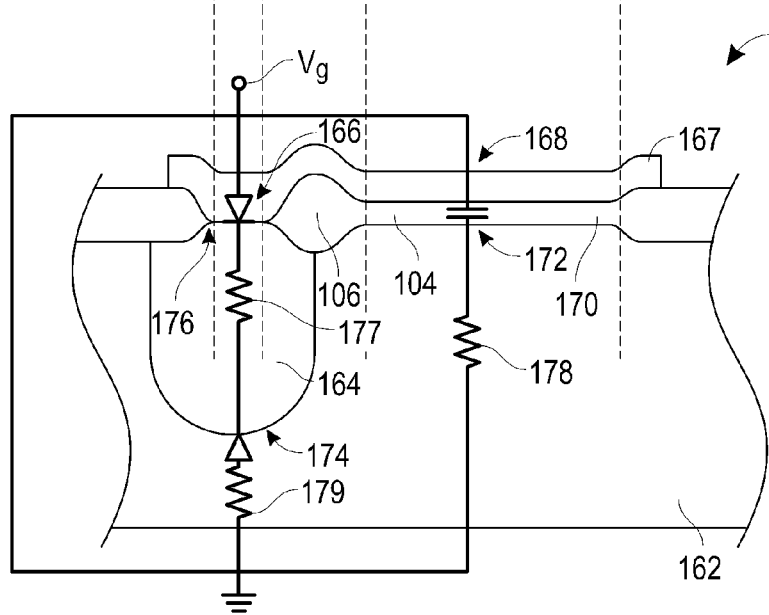

FIGS. 5A and 5B show a top down view and a cross-sectional view, respectively, of a partially fabricated MOSFET 160 coupled to a diode discharge path according to another embodiment of the present invention. The structure is shown after forming the common gate electrode 87 and prior to S/D doping 88 of FIG. 2B. The partially fabricated MOSFET 160 includes a p-type semiconductor substrate (P-SUB) 162, an n-well region 164 formed in the P-SUB 162, a first device region 166, a gate dielectric layer 170 formed over the P-SUB 162 in a second device region 168, and a common electrode 167 formed over the first and second device regions 166, 168. It will be understood in view of the discussion above of FIGS. 3A-4B that the doped regions can have different conductivity types.

Referring to the top down view of the example implantation of the partially fabricated MOSFET 160 illustrated in FIG. 5B, similar to the common electrode 96 of FIG. 3A, the common electrode 167 has a rectangular form having an electrode length in the y-direction and an electrode width in the x-direction. Also similar to the common electrode 96 of FIG. 3A, other implementations are possible, such as the common electrode 160 having a rectangular form with rounded corners or an elliptical form, among others.

In the embodiment of FIG. 5A, similar to the common electrode 96 of FIG. 3A, the common electrode 160 overlaps the first and second device regions 166 and 168. The first device region 166 has a rectangular area $A_5$ approximately defined by a device width $W_5$ multiplied by a device length $L_5$. The second device region 168 has a rectangular area $A_6$ approximately defined by a device width $W_6$ multiplied by a device length $L_6$. The dimensions $W_5$, $L_5$, $W_6$, and $L_6$ can be substantially similar to the corresponding dimensions $W_1$, $L_1$, $W_2$, and $L_2$, respectively, discussed above in connection with the first and second device regions 98 and 100 in FIG. 3A.

Referring to FIG. 5B, unlike FIGS. 3B and 4B, the n-well region 164 is disposed in the P-SUB 162 to overlap the first device region 166 but not overlap the second device region 168. The first device region 166 corresponds to the region approximately defined by an area of contact between the common electrode 167 and the substrate 162, particularly the n-well region 164. The second device region 168 corresponds to the region approximately defined by the gate dielectric layer 170. The area of contact between the common electrode 167 and the n-well region 164 in the first device region 166 and the gate dielectric layer 170 in the second device region 168 are separated in the x-direction by field isolation 106. The common electrode 167 thus extends continuously over the area of contact between the common electrode 167 and the n-well region 164 in the first device region 166 and over the gate dielectric layer 170 in the second device region 168.

FIG. 5B is annotated with relevant circuit elements. The partially fabricated MOSFET 160 of FIG. 5B includes a discharge P+N diode 176, a tunnel barrier capacitor 172, a PN diode 174, an first resistor 177, a second resistor 178, and a third resistor 179. In one embodiment, the common electrode 167 is heavily doped with a p-type dopant to form a p+ layer. In this embodiment, the discharge P+N diode 176 includes a junction formed by the common electrode 167 and the n-well region 164 forming a P-side and an N-side of the discharge P+N diode 176. The tunnel barrier capacitor 172 comprises the gate dielectric layer 170 sandwiched between the common electrode 167 as an upper electrode and the P-SUB 162 in the second device region 168 as a lower electrode. The first PN diode 174 is formed by a junction formed by the P-SUB 162 and the n-well region 164 forming a P-side and an N-side of the PN diode 174, respectively.

In another embodiment, the common electrode 167 can include any suitable metal to form a Schottky junction between the common electrode 167 and the n-well region. In this embodiment, the discharge diode 176 is a Schottky diode. The metal can have a suitably high work function to provide a desired threshold voltage of the Schottky diode, for example between about 4.5 eV to 5.3 eV.

During plasma processing, the P+ side of the P+N discharge diode 176 and the upper electrode of the tunnel barrier capacitor 172 are electrically connected to each other and are at a gate potential $V_g$, as described above in connection with equation [1]. The N-side of the P+N discharge diode 176 is connected to the N-side of the PN diode 174 through the first resistor 177. The P-side of the PN diode 174 is connected to a first end of the third resistor 179. The lower electrode of the tunnel barrier capacitor 172 is electrically connected to a second end of the third resistor 179 through the second resistor 178, which is in turn connected to the substrate which may be at a lower potential such as the ground potential of a wafer chuck of a plasma process tool. Under this configuration, the discharge P+N diode 176 and the PN diode 174 are connected at the N-sides through the first resistor 177 in a back-to-back configuration. When the potential of the gate material being etched (serving as the P+ side of the P+N discharge diode 176 and the upper electrode of the tunnel barrier capacitor 172) is at a $V_g$ having a positive value through accumulation of net positive charge as described in connection with equation [1], the discharge P+N diode 176 is forward biased and the PN diode 174 is reverse biased. On the other hand, when the gate material is at a $V_g$ having a negative value through accumulation of net negative charge as described in connection with equation [1], the discharge P+N diode 176 is reverse biased and the PN diode 174 is forward biased.

The result of the configuration in FIGS. 5A and 5B is that two current paths from the common gate electrode 167 at Vg to the p-type semiconductor substrate 162 at a lower voltage such as the ground potential exist during and after completion of the gate etch process. A first current path is through the discharge P+N diode 176, the first resistor 177, the PN diode 174, and the third resistor 179. A second current path is through the tunnel barrier capacitor 172 and the second resistor 178. Because of the relatively high thickness of the gate dielectric layer 170 of the tunnel barrier capacitor 172, the preferred current path is the first current path, thereby protecting the gate dielectric layer 170 during and after completion of the gate etch process.

As discussed above in connection with FIG. 4B above, because the first tunnel barrier capacitor 150 has the tunnel dielectric layer 134 that is substantially thinner than the gate dielectric layer 136 of the second tunnel barrier capacitor 152, the preferred current path during plasma processing of the partially fabricated MOSFET 120 is through the tunnel dielectric layer 134, thereby protecting the gate dielectric layer 136. A detailed description of the dependence of the difference in the amount of current flow through the first and second tunnel barrier capacitors 150, 152 is given herein. Although the description is given in reference to the NMOS device of FIGS. 4A and 4B as an example, the concepts are similarly applicable to other embodiments, for example the PMOS device of FIGS. 3A and 3B, or the NMOS device of FIGS. 5A and 5B, among other similar device structures.

Generally, electrical current from the quantum-mechanical phenomenon of electron tunneling through a tunnel barriers such as a dielectric barrier include two components, namely direct tunneling and Fowler-Norheim (FN) tunneling. Direct tunneling may dominate a current through the dielectric barrier when the tunnel barrier is substantially rectangular or trapezoidal, while FN tunneling may dominate the current through the dielectric barrier when the tunnel barrier is substantially triangular. For example, direct tunneling may dominate the current through an $SiO_2$ tunnel barrier when the equivalent oxide thickness is below about 3-4 nm or below, whereas FN tunneling dominates for thicker dielectrics. A rectangular tunnel barrier under relatively low electric field conditions may become a triangular tunnel barrier under relatively high electric field conditions. The electron tunneling current density under FN tunneling conditions depends exponentially on the electric field across the tunnel barrier, as expressed by the equation $$J_{FN} = A\left(\frac{V_g}{T_{diel}}\right)\exp\left(-\frac{BT_{diel}}{V_g}\right), \quad [2]$$

where Tdiel is the dielectric thickness, Vg is the voltage across the dielectric, and A and B are constants. During plasma processing, such as but not limited to plasma etching, $V_g$ is the gate potential which may either be positive or negative, as discussed in connection with equation [1]. When current flows through a partially fabricated transistor through FN tunneling, $J_{FN}$ of equation [2] multiplied by a tunneling area, such as the first through third rectangular areas $A_1$-$A_3$ described above for FIGS. 3A, 4A and 5A, may be approximately equal the $J_p$ of equation [1] multiplied by an antenna area, which may include the tunneling area, such as first through third rectangular areas $A_1$-$A_3$.

FIGS. 6A-6C schematically show electronic band diagrams of the first tunnel barrier capacitor 150 of FIGS. 4A-4B under various voltage conditions. FIGS. 6D-6F schematically show an electronic energy band diagram of the second tunnel barrier capacitor 152 of FIGS. 4A-4B under various voltage conditions. As a person skilled in the art will understand, an electronic energy band diagram schematically illustrates the electronic energy levels of various regions of a solid by representing the electronic energy levels of the solid in the y-axis and a physical dimension of the solid in the x-axis. Because the y-axis represents the electronic energy levels, electrons "travel downwards" and holes "travel upwards." A person skilled in the art will also understand that solids such as semiconductors and insulators may be represented as having a conduction band edge, denoted as $E_C$, and a valence band edge, denoted as $E_V$, and a Fermi energy level denoted as $E_F$, in FIGS. 6A-6F. The conduction band edge $E_C$ is associated with the lowest unoccupied electronic energy state of the solid and the valence band edge $E_V$ is associated with the highest occupied electronic energy state of the solid. Fermi energy is associated with the energy at which the probability of finding an electron at zero degrees Kelvin is 50%.

The example band diagrams of the first tunnel barrier capacitor 150 in FIGS. 6A-6C illustrates the tunnel dielectric layer 134 as an electron tunneling barrier between the p-well region 124 as an electron injecting electrode and the common electrode 128 as an electron receiving electrode. The first p-well region 124 has a first conduction band edge $E_{C1}$, a first Fermi energy level $E_{F1}$, and a first valence band edge $E_{V1}$. The common electrode 128 has a second conduction band edge $E_{C2}$, a second Fermi energy level $E_{F2}$, and a second valence band edge $E_{V2}$. The tunnel dielectric layer 134 has a third conduction band edge $E_{C3}$, a third valence band edge $E_{V3}$, and a third Fermi energy level $E_{F3}$.

The example band diagram of the first tunnel barrier capacitor 150 in FIG. 6A illustrates a condition where the $V_g$ in FIG. 4B is about zero, before the start of a plasma processing or during a plasma processing condition where the common electrode 128 has not collected a net charge. Under this condition, the first conduction band edge $E_{C1}$, the second conduction band edge $E_{C2}$, and the third conduction band edge $E_{C3}$ may be represented as substantially unchanging in the x-direction, any change thereto being caused by non-ideal conditions such as trapped charge in the tunnel dielectric layer 134. Under this condition, a first rectangular barrier that an electron tunnels through can be approximated as having a first barrier height of $\Phi_{B1}$ on a first injecting side and an initial tunneling distance having a $d_0$. Under this condition, the initial tunneling distance $d_0$ may be equivalent to the first thickness of the tunnel dielectric layer 134. A person skilled in the art will understand that the probability of electrons occupying the energy states at or above the first Fermi energy level $E_{F1}$ in the first p-well region 124 tunneling across the tunnel dielectric layer 134 having a third conduction band edge $E_{C3}$ is insufficient to cause an appreciable electrical current to flow through the first tunnel barrier capacitor 150.

The example band diagram of the first tunnel barrier capacitor 150 in FIG. 6B illustrates a condition where the $V_g$ in FIG. 4B is at a first positive voltage, as in a plasma processing condition where the common electrode 128 has collected a first net positive charge $Q_1$. Under this condition, the first conduction band edge $E_{C1}$, the second conduction band edge $E_{C2}$, and the third conduction band edge $E_{C3}$ may be represented as bending downwards in the x-direction. For clarity, bending of the first conduction band edge $E_{C1}$ and the second band edge $E_{C2}$ due to depletion effects in the first p-well region 124 and the common electrode 128 are not shown. The third conduction band edge $E_{C3}$ bends downwards linearly in the x-direction towards the common electrode 128 and has a slope of $qV_1/d_0$, where q is the electronic charge, $V_1$ is a first voltage dropped across the tunnel dielectric layer 134, and $d_0$ is the initial tunneling width. Under this condition, the barrier that an electron tunnels through may be approximated by a first triangular barrier having the first barrier height of $\Phi_{B1}$ on a first injecting side and a first tunneling distance $d_1$. Under this condition, the first tunneling distance $d_1$ is less than the first thickness of the tunnel dielectric layer 134. A person skilled in the art will understand that the probability of electrons occupying the energy states at or above the first Fermi energy level $E_{F1}$ in the first p-well region 124 tunneling across the tunnel dielectric layer 134 having a third conduction band edge $E_{C3}$ can be approximated by a first FN tunneling current based on equation [2] where $V_g=V_1$.

The example band diagram of the first tunnel barrier capacitor 150 in FIG. 6C illustrates a condition where the $V_g$ in FIG. 4B is at a second positive voltage greater than the first positive voltage, as in a plasma processing condition where the common electrode 128 has collected a second net positive charge $Q_2$ greater than $Q_1$. As in FIG. 6B, under this condition, the first conduction band edge $E_{C1}$, the second conduction band edge $E_{C2}$, and the third conduction band edge $E_{C3}$ may be represented as bending downwards in the x-direction towards the common electrode 128. Also as in FIG. 6B, for clarity, bending of the first conduction band edge $E_{C1}$ and the second band edge $E_{C2}$ are not shown. The third conduction band edge $E_{C3}$ in FIG. 6C bends downwards linearly in the x-direction towards the common electrode 128 and has a second slope $qV_2/d_0$ greater than the first slope $qV_1/d_0$, where q is the electronic charge, a second voltage $V_2$ greater than $V_1$ is a second voltage dropped across the tunnel dielectric layer 134, and $d_0$ is the initial tunneling distance. Under this condition, the barrier that an electron tunnels through may be approximated by a second triangular barrier having a barrier height of $\Phi_{B1}$ on a first injecting side and a second tunneling distance $d_2$ shorter than the first tunneling distance $d_1$. A person skilled in the art will understand that the probability of electrons occupying the energy states at or above the first Fermi energy level $E_{F1}$ in the first p-well region 124 tunneling across the second tunnel dielectric layer 134 having a third conduction band edge $E_{C3}$ can be approximated by a second FN tunneling current based on equation [2] where $V_g=V_2$.

The example band diagram of the second tunnel barrier capacitor 152 in FIGS. 6D-6F illustrate the gate dielectric layer 136 as an electron tunneling barrier between the p-well region 124 as an electron injecting electrode and the common electrode 128 as an electron receiving electrode. As in FIGS. 6A-6C, the p-well region 124 has a first conduction band edge $E_{C1}$, a first Fermi energy level $E_{F1}$, and a first valence band edge $E_{V1}$. The common electrode 128 has a second conduction band edge $E_{C2}$, a second Fermi energy level $E_{F2}$, and a second valence band edge $E_{V2}$. The gate dielectric layer 136 has a third conduction band edge $E_{C3}$, a third valence band edge $E_{V3}$, and a third Fermi energy level $E_{F3}$.

The example band diagram of the second tunnel barrier capacitor 152 in FIG. 6D illustrates a condition where the $V_g$ in FIG. 4B is about zero as in FIG. 6A, before the start of plasma processing or during a plasma processing condition where the common electrode 128 has not collected a net charge. Under this condition, the first conduction band edge $E_{C1}$, the second conduction band edge $E_{C2}$, and the third conduction band edge $E_{C3}$ may be represented as substantially unchanging in the x-direction towards the second common electrode 128, any change thereto being caused by non-ideal conditions such as trapped charge in the gate dielectric layer 136. Under this condition, a second rectangular barrier that an electron tunnels through may be approximated by a second barrier height of $\Phi_{B2}$ on a first injecting side and an initial tunneling distance $d_3$. Under this condition, the initial tunneling distance $d_3$ may be equivalent to the second thickness of the gate dielectric layer 136. A person skilled in the art will understand that the probability of electrons occupying the energy states at or above the first Fermi energy level $E_{F1}$ in the first p-well region 124 tunneling across the gate dielectric layer 136 having a third conduction band edge $E_{C3}$ is insufficient to cause an appreciable electrical current to flow through the second tunnel barrier capacitor 152.

The example band diagram of the second tunnel barrier capacitor 152 in FIG. 6E illustrates a condition where the $V_g$ in FIG. 4B is at the first positive voltage equal to the first positive voltage in FIG. 6B, as in a plasma processing condition where the common electrode 128 has collected the first net positive charge $Q_1$. Under this condition, the first conduction band edge $E_{C1}$, the second conduction band edge $E_{C2}$, and the third conduction band edge $E_{C3}$ may be represented as bending downwards in the x-direction towards the common electrode 128. For clarity, bending of the first conduction band edge $E_{C1}$ and the second band edge $E_{C2}$ due to depletion effects in the p-well region 124 and the common electrode 128 are not shown. The third conduction band edge $E_{C3}$ bends downwards linearly in the x-direction towards the common electrode 128 and has a third slope of $qV_1/d_3$, where q is the electronic charge, $V_1$ is the first voltage dropped across the gate dielectric layer 136, and $d_3$ is the initial tunneling width. Under this condition, the barrier that an electron tunnels through may be approximated by a first trapezoidal barrier, instead of a triangular barrier as in FIG. 6B, having the second barrier height of $\Phi_{B2}$ on a first injecting side and a fourth tunneling distance $d_4$. Under this condition, the fourth tunneling distance $d_4$ may be the same as the third tunneling distance $d_3$ of FIG. 6D because the barrier is trapezoidal instead of being triangular. A person skilled in the art will understand that in contrast to FIGS. 6B and 6C, the probability of electrons occupying the energy states at or above the first Fermi energy level $E_{F1}$ in the p-well region 124 tunneling across the gate dielectric layer 136 cannot be approximated by a FN tunneling current based on equation [2]. Instead, the probability may be expressed by a direct tunneling equation different from equation [2].

The example band diagram of the second tunnel barrier capacitor 152 in FIG. 6F illustrates a condition where the $V_g$ in FIG. 4B is at a second positive voltage greater than the first positive voltage, as in a plasma processing condition where the common electrode 128 has collected a second net positive charge $Q_2$ greater than $Q_1$. As in FIG. 6E, under this condition, the first conduction band edge $E_{C1}$, the second conduction band edge $E_{C2}$, and the third conduction band edge $E_{C3}$ may be represented as bending downwards in the x-direction towards the common electrode 128. Also as in FIG. 6E, for clarity, bending of the first conduction band edge $E_{C1}$ and the second band edge $E_2$ are not shown. The third conduction band edge $E_{C3}$ in FIG. 6C bends downwards linearly in the x-direction towards the common electrode 128 and has a fourth slope of $qV_2/d_3$ greater than the third slope $qV_1/d_3$, where q is the electronic charge, the second voltage $V_2$ greater than the first voltage $V_1$ is the voltage dropped across the gate dielectric layer 136, and $d_3$ is the initial tunneling distance. Under this condition, similar to FIGS. 6B and 6C, the barrier that an electron tunnels through may be approximated by a triangular barrier. The triangular barrier has a second barrier height $\Phi_{B2}$ on a first injecting side and a fifth tunneling distance $d_5$ shorter than the fourth tunneling distance $d_4$ of FIG. 6E but longer than the second tunneling distance $d_2$ of FIG. 6C. A person skilled in the art will understand that the probability of electrons occupying the energy states at or above the first Fermi energy level $E_{F1}$ in the p-well region 124 tunneling across the gate dielectric layer 136 having a third conduction band edge $E_{C3}$ can approximated by a third FN tunneling current based on equation [2] where $V_g=V_2$.

While the foregoing illustrations of FIGS. 6A-6F have been made with an example of condition of the common electrode 128 having a positive $V_g$ leading to the first p-well region 124 as the electron-injecting electrode of the first and second tunnel barrier capacitors 150, 152, similar illustrations can be made with an example condition of the common electrode 128 having a negative $V_g$ leading to the common electrode 128 as the electron-injecting electrode of the first and second tunnel barrier capacitors 150 and 152.

In addition, while the foregoing illustrations of FIGS. 6A-6F have been made with an example embodiment having a p-type semiconductor such as the p-well region 124 of FIG. 4B as the lower electrode, other embodiments are possible. For example, the lower electrode can be an n-type semiconductor, such as the n-well region 94 of FIG. 3B.

In addition, while the foregoing illustrations of FIGS. 6A-6F have been made with an example embodiment having a p-type semiconductor such as a p-type silicon as the common electrode, other embodiments include a suitable p-type metal gate (i.e., metal gates resulting in similar barrier heights $\Phi_{B1}$ and $\Phi_{B2}$ of a p-type semiconductor) as the common electrode. In addition, while the foregoing illustrations of FIGS. 6A-6F have been made with an example embodiment having a p-type semiconductor such as silicon as the common electrode, other embodiments of the present invention include a suitable n-type semiconductor as the common electrode. Other embodiments include a suitable n-type metal gate (i.e., metal gates resulting in similar barrier heights $\Phi_{B1}$ and $\Phi_{B2}$ as the n-type semiconductor) as the common electrode.

In FIGS. 6A-6F, in one embodiment, the first barrier height $\Phi_{B1}$ may be the difference between the third conduction band edge $E_{C3}$ and the first Fermi energy $E_{F1}$ of the p-well region 124 as an injecting electrode and may have a value between about 3.5 eV and 5 eV, for example, between $SiO_2$ as the gate dielectric layer, and Si having various doping levels as the injecting electrode. In another embodiment, $\Phi_{B1}$ and $\Phi_{B2}$ may be 2 eV to 3.5 eV. In yet another embodiment, $\Phi_{B1}$ may be 0.5 eV to 2 eV.

In one embodiment, the second barrier height $O_{B2}$ may be the difference between the third conduction band edge $E_{C3}$ and the first Fermi energy $E_{F1}$ of the p-well region 124 as an injecting electrode and may have a value between about 3.5 eV and 5 eV, for example, between $SiO_2$ as the tunnel dielectric layer 134, and Si having various doping levels as the injecting electrode. In another embodiment, $\Phi_{B1}$ and $\Phi_{B2}$ may be 2 eV to 3.5 eV. In yet another embodiment, $\Phi_{B1}$ may be 0.5 eV to 2 eV.

Figure 7:
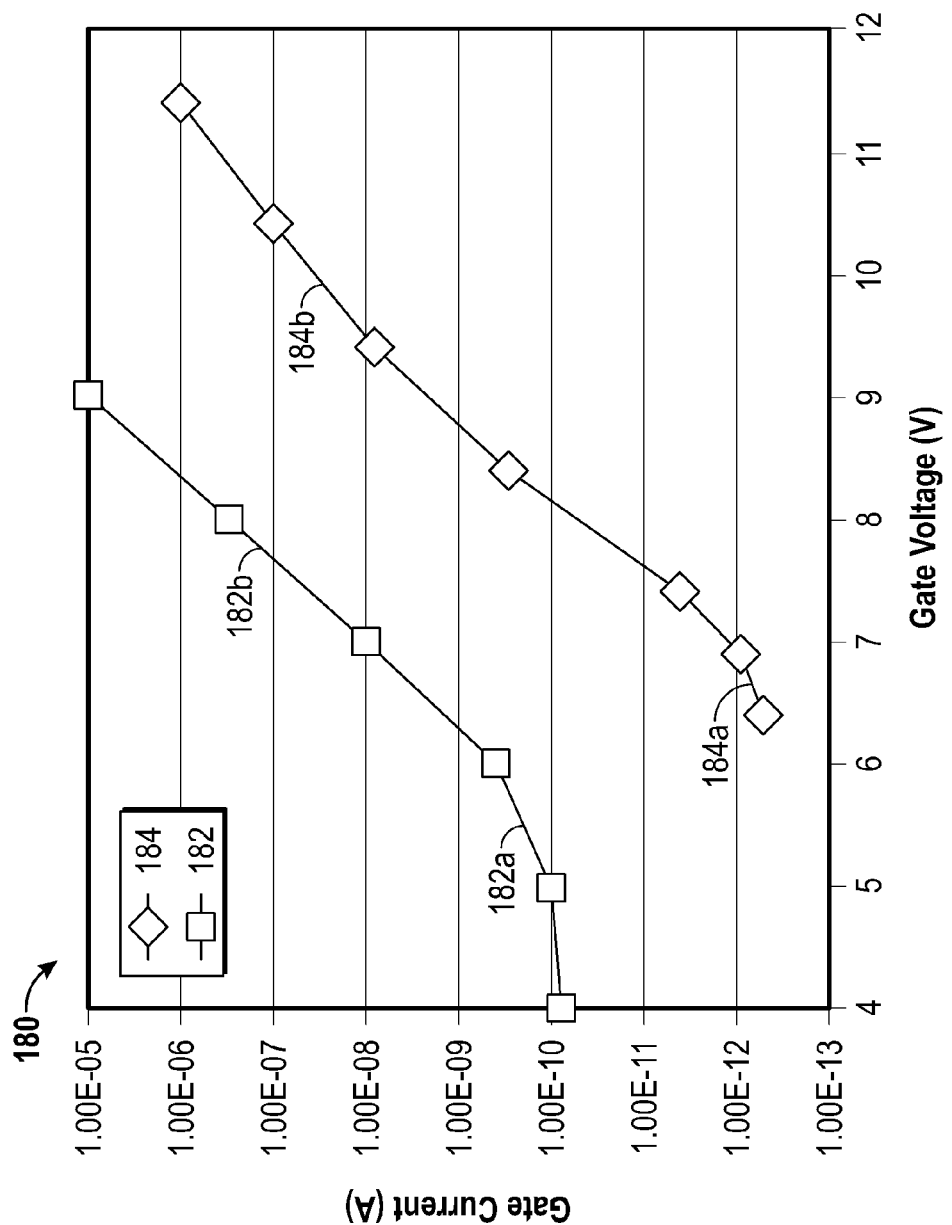
FIG. 7 is a graph illustrating electron current flowing through thin and thick tunnel barrier capacitors according to one embodiment.

FIG. 7 is a graph illustrating electron current flowing through first and second tunnel barrier capacitors 150 and 152 of the partially fabricated MOSFET 120 of FIGS. 4A-4B, according to one embodiment. In particular, a calculated current-voltage (IV) curve 182 illustrates, on the y-axis, a calculated current flowing through the first tunnel barrier capacitor 150 (including the tunnel dielectric layer 134 having a thickness of about 7 nm) in units of Amps (A), in response to a positive voltage applied on the common electrode 128, in units of Volts (V). In this illustration, the tunnel dielectric layer 134 is a $SiO_2$ layer, the common electrode 128 is a p-type silicon with a dopant concentration of about 1e16/cm³, and the p-well region 124 is a p-type silicon with a dopant concentration of about 1e15/cm³. The calculated current-voltage (IV) curve 182 includes a relatively slow-varying direct tunneling regime 182a at a $V_g$ less than about 5.5V, followed by a relatively rapidly-varying Fowler-Nordheim (FN) tunneling regime 182b at a $V_g$ greater than about 5.5V.

In addition, a calculated current-voltage (IV) curve 184 illustrates, on the y-axis, a calculated current flowing through the second tunnel barrier capacitor 152 (including the gate dielectric layer 136 having a fourth thickness of about 13 nm) in units of Amps (A), in response to a positive voltage applied on the common electrode 128, in units of Volts (V). In this illustration, the tunnel dielectric layer 134 comprises a $SiO_2$ layer, the common electrode 128 is a p-type silicon with a dopant concentration of about 1e16/cm³, and the p-well region 124 is a p-type silicon with a dopant concentration of about 1e15/cm³. The calculated current-voltage (IV) curve 184 includes a relatively slow-varying direct tunneling regime 184a at a $V_g$ less than about 7V, followed by a relatively rapidly-varying Fowler-Nordheim (FN) tunneling regime 182b at a $V_g$ greater than about 7V.

As illustrated, in relatively rapidly-varying FN tunneling regimes 182b, 184b, at a given voltage, the difference in the calculated current values can be about 3.5 to 4 orders of magnitude. For example, at an applied voltage of 7V on the common electrode 128, the calculated current values for the first and second tunnel barrier capacitors 150, 152 are calculated to be approximately $1\times10^{-12}$ A and $1\times10^{-8}$ A, respectively.

Figure 8A:
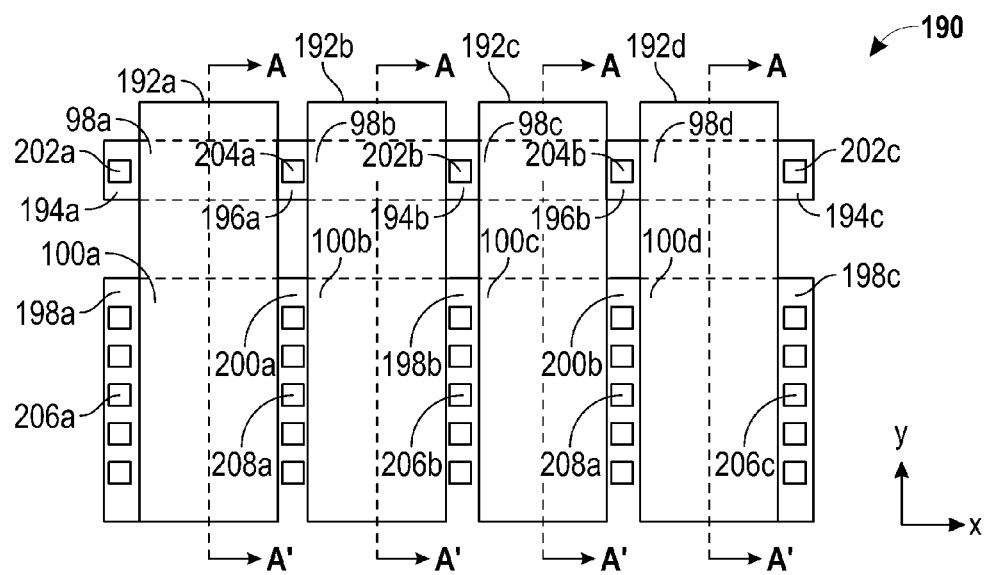
FIG. 8A is a plan view of a plurality of common-gated dual oxide MOSFETs according to one embodiment.

FIG. 8A is a plan layout view of a plurality of common-gated dual thickness dielectric (e.g, dual oxide) MOSFETs 190 according to one embodiment. Each of the plurality of MOSFETs 190 may be a PMOS device corresponding to the illustrated MOSFET 90 of FIG. 3A after forming the common gate(s) 87 and S/D doping 88 and partial completion of the interconnect formation step 89 of FIG. 2B, up to and including the source/drain/gate contact formation process. In this embodiment, the tunnel dielectric layer 102 and the gate dielectric layer 104 represent a relatively thin dielectric and a relatively thick dielectric of one of the plurality of MOSFETs 190, respectively. In addition, the common electrode 96 of FIG. 3A represents a common gate of one of the plurality of MOSFETs 190.

The plurality of common-gated dual thickness dielectric MOSFETs 190 in the example embodiment of FIG. 8A includes a first MOSFET 190a, a second MOSFET 190b on a first side of the first MOSFET 190a, a third MOSFET 190c on a first side of the second MOSFET 190b, and a fourth MOSFET 190d on a first side of the third MOSFET 190c.

The plurality of MOSFETs 190 includes first through fourth common gates 192a through 192d corresponding to first through fourth MOSFETS 190a though 190d, respectively. The first through fourth common gates 192a through 192d include first through fourth thin dielectric (e.g., thin oxide) device regions 98a-98d corresponding to the first through fourth MOSFETs 190a though 190d, respectively. Each of the first through fourth thin oxide device regions 98a-98d may corresponds to the first device region 98 in FIGS. 3A-3B, which is shown prior to S/D doping 88 of FIG. 2B.

The first through fourth common gates 192a-192d additionally include first though fourth thick dielectric (e.g., thick oxide) device regions 100a-100d corresponding to first through fourth MOSFETs 190a-190d, respectively. Each of the first though fourth thick oxide device regions 100a-100d may correspond to the second device region 100 in FIGS. 3A-3B, which is shown prior to the S/D doping 88 of FIG. 2B.

Similar to FIG. 3A, each of the first device regions 98a-98d of the first through fourth MOSFETs may have a first rectangular area $A_1$ approximately defined by a first device width W1 multiplied by a first device length $L_1$. Also similar to FIG. 3A, each of the second device regions 100a-100d of the first through fourth MOSFETs has a second rectangular area $A_2$ approximately defined by a second device width $W_2$ multiplied by a a second device length $L_2$.

The plurality of MOSFETs 190 in the illustrated embodiment of FIG. 8A further includes first through third common source regions 194a-194c of thin oxide protective devices in the first device regions 98a-98d; first and second common drain regions 196a and 196b of thin oxide protective devices in the first device regions 98a-98d; first through third common source regions 198a-198c of operational MOSFETs in the thick oxide device regions 100a-100d; first and second common drain regions 200a and 200b of operational MOSFETs in the thick oxide device regions 100a-100d; first through third common source contacts 202a-202c of thin oxide protective devices in the first device regions 98a-98d; first and second common drain contacts 204a and 204b of thin oxide protective devices in the first device regions 98a-98d; first through third common source contacts 206a-206c of operational MOSFETs in the thick oxide device regions 100a-100d; and first and second common drain contacts 208a and 208b of operational MOSFETs in the thick oxide device regions 100a-100d.

Figure 8B:
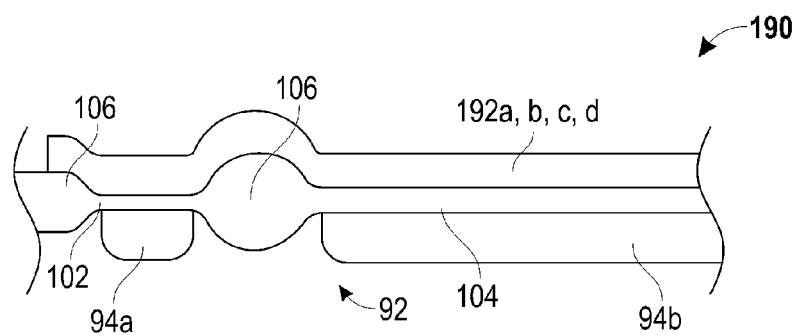
FIG. 8B is a cross sectional view of one of the common-gated dual oxide MOSFETs of FIG. 8A according to one embodiment.

The illustrated sources, drains and contacts for the protective devices in the first (thin oxide) device regions 98a-98d need not be connected to any power or voltage sources. In fact, the contacts 202a-202c, 204a-204b can be omitted, or left floating, and even the doping of the source/drain regions 194a-194c, 196a-196b can be omitted. The protective devices in the first regions 98a-98d can be non-functional in the final product, as their primary function is during plasma processing to draw current from plasma charge build up in the gate away from the functional gate oxides of the 110 of the second (thick oxide) device regions 100a-100d. The sources, drains and contacts are illustrated in the example of FIG. 8B because they can be readily formed simultaneously as other low voltage (e.g., 3.3 V) transistors on the chip (not shown), which are employed as core logic devices elsewhere on the integrated circuit. The gate dielectric thickness in these regions can similarly be common with the core logic low voltage transistors simultaneously fabricated elsewhere on the integrated circuit.

First and third common source regions 198a and 198c of the second (thick oxide) device regions 100a-100d serve as source regions for the first and fourth MOSFETs 190a and 190d, respectively, and the second common source region 198b serves as a source region for the second and third MOSFETs 190b and 190c, respectively. The first drain region 200a serves as a drain for the first and second MOSFETs 190a and 190b, respectively. The second drain region 200b serves as a drain for the third and fourth MOSFETs 190c and 190d, respectively.

In addition, while the embodiment of FIG. 8A was illustrated using MOSFETs 190 being PMOS devices corresponding to the illustrated MOSFET 90 of FIG. 3A after forming the common gate(s) 87 and S/D doping 88 and partial completion of the interconnect formation step 89 of FIG. 2B, up to and including the source/drain/gate contact formation process, other embodiments are possible. For example, MOSFETs similar to FIG. 8A may be NMOS devices corresponding to the illustrated MOSFET 120 of FIG. 4A after forming the common gate(s) 87 and S/D doping 88 and partial completion of the interconnect formation step 89 of FIG. 2B, up to and including the source/drain/gate contact formation process.

While the embodiment of FIG. 8A was illustrated with four common-gated dual oxide MOSFETs 190, other embodiments having any suitable number of common-gated dual oxide MOSFETs is possible. For example, in one embodiment, the MOSFETs 190 may include 32 PMOS devices and/or 32 NMOS devices. In another embodiment, the MOSFETs 190 may include 64 PMOS devices and/or 64 NMOS devices, and so on.

FIG. 8B is a cross-sectional view of one of the common-gated dual thickness dielectric MOSFETs 190a-d of FIG. 8A taken along one of the cross-sections A-A'. The cross-sectional view of the MOSFET 190 of FIG. 8A includes a p-type semiconductor substrate (P-SUB) 92 in which a first and second n-well regions 94a and 94b are formed. The MOSFET 190 additionally includes a thin oxide protective device formed over a first n-well region 94a and a thick oxide MOSFET formed over a second n-well region 94b. The thin oxide protective device is formed over a region approximately defined by the tunnel dielectric layer 102 and the thick oxide MOSFET is formed over a region approximately defined by the gate dielectric layer 104. The tunnel dielectric layer 102 and the gate dielectric layer 104 are separated by field isolation 106. The MOSFET 190 additionally includes one of first through fourth common gates 192a-192d of the first through fourth MOSFETs 190a-d formed over the tunnel dielectric layer 102 and the gate dielectric layer 104.

Figure 9:
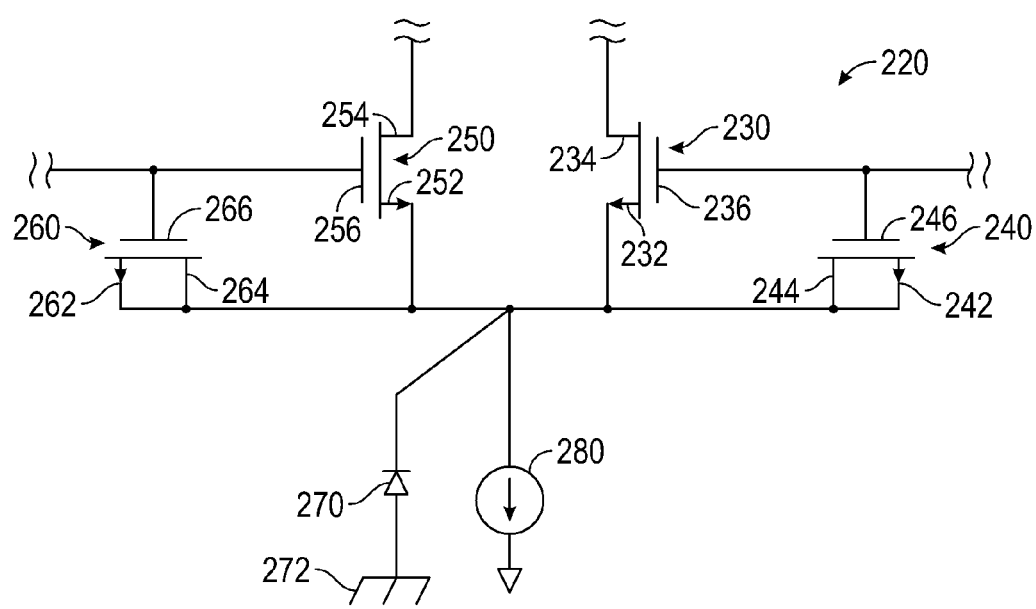
FIG. 9 is a circuit diagram of a differential pair of common-gated dual oxide MOSFETs according to one embodiment.

FIG. 9 illustrates a circuit diagram of a differential pair 220 of common-gated dual thickness dielectric (e.g., dual oxide) MOSFETs according to one embodiment. The illustrated MOSFETs 220 may be a PMOS device or an NMOS device.

The differential pair 220 includes a first MOSFET including a first thick dielectric (e.g., oxide) operational MOSFET 230 and a first protective device 240. The first thick oxide MOSFET 230 includes a source 232, a drain 234, and a gate 236. The first protective device 240 includes a source 242, a drain 244, and a gate 246. The gates 230 and 246 of the two devices are connected to form a common gate similar to common gates 192a-d in the embodiment of FIG. 8A. In addition, the drain 232 of the first thick oxide MOSFET 230 and the source 242 and the drain 244 of the first protective device 246 are connected to each other and to a back gate isolation diode 270 connected to the substrate 272, which may be grounded, and further connected to a current source 280. With the source 242 shorted to the drain 244, the first protective device 240 does not operate as a switch in the final product.

The differential pair 220 additionally includes a second common-gated dual thickness dielectric (e.g., dual oxide) MOSFET including a second thick dielectric (e.g., oxide) operational MOSFET 250 and a second protective device 266. The second thick oxide MOSFET 250 includes a source 252, a drain 254, and a gate 256. The second protective device 260 includes a source 262, a drain 264, and a gate 266. The gates 256 and 266 of the two devices are connected to form a common gate similar to common gates 192a-d in the embodiment of FIG. 8A. In addition, the drain 252 of the second thick oxide MOSFET 250 and the source 262 and the drain 264 of the second protective device 260 are connected to each other and to the back gate isolation diode 270 connected to the substrate 272, which may grounded, and further connected to a current source 280. With the source 262 shorted to the drain 264, the second protective device 260 does not operate as a switch in the final product.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An integrated circuit device comprising a common-gated dual-thickness dielectric MOSFET, comprising:
   a semiconductor substrate;
   a protective device comprising a first gate dielectric having a first thickness and formed over a first channel region;
   a MOSFET comprising a second gate dielectric thicker than the first gate dielectric and formed over a second channel region; and
   a common gate electrode serving as a gate electrode of the protective device and as a gate electrode of the MOSFET,
   wherein the protective device is configured to protect the MOSFET during fabrication of the MOSFET and is not configured as a final functional device.

2. The integrated circuit device of claim 1, wherein the common electrode, the first gate dielectric, and the first channel region form a first tunnel barrier capacitor configured to conduct a first current density during a plasma process.

3. The integrated circuit device of claim 2, wherein the common electrode, the second gate dielectric layer, and the second channel form a second tunnel barrier capacitor configured to conduct a second current density lower than the first current density during the plasma process.

4. The integrated circuit device of claim 3, wherein a ratio of the second thickness to the first thickness is between about 1.5 and 2.0.

5. The integrated circuit device of claim 3, further comprising a well region, wherein the semiconductor substrate is a p-type semiconductor substrate, the well region is an n-type well, and the common electrode is an n-type common electrode.

6. The integrated circuit device of claim 3, wherein the protective device and the MOSFET are separated by an isolation oxide region formed between the first gate dielectric and the second gate dielectric.

7. The integrated circuit device of claim 5, wherein the semiconductor substrate forms a P-side of a PN diode and the well region forms an N-side of the PN diode.

8. The integrated circuit device of claim 7, wherein the first and second channel regions are connected to the N-side of the PN diode, and the P-side of the PN diode is configured to be at a ground potential lower than a gate potential of the common electrode in absolute value during the plasma process.

9. The integrated circuit device of claim 8, wherein the first tunnel barrier capacitor is configured to conduct the first tunneling current during the plasma process between the common electrode and the P-side of the PN diode and the second tunnel barrier capacitor is configured to conduct the second tunneling current during the plasma process between the first common electrode and the P-side of the PN diode, wherein the first tunneling current is at least about 1,000 times higher than the second tunneling current.

10. The integrated circuit device of claim 9, wherein the first thickness is in the range between 5 nm and 10 nm, and wherein the second thickness is in the range between 11 nm between 15 nm.

11. The integrated circuit device of claim 3, further comprising a well region, wherein the semiconductor substrate is a p-type semiconductor substrate, the well region is a p-type well, and the common electrode is a p-type common electrode.

12. The integrated circuit device of claim 11, further comprising an n-tub isolation surrounding the well region, the n-tub isolation comprising an isolation n-well and an n-type buried well.

13. The integrated circuit device of claim 12, wherein the well forms a P-side of a first PN diode and the n-tub isolation forms an N-side of the first PN diode.

14. The integrated circuit device of claim 13, wherein the semiconductor substrate forms a P-side of a second PN diode and the n-tub isolation forms an N-side of the second PN diode.

15. The integrated circuit device of claim 14, wherein the first and second channel regions are configured to be connected to the P-side of the first PN diode, the N-side of the first PN diode is connected to the N-side of the second PN diode, and the P-side of the second PN diode is configured to be at a ground potential lower than a gate potential of the common electrode in absolute value during the plasma process.

16. An integrated circuit device comprising a plurality of common-gated dual-thickness dielectric MOSFETs, comprising:
a semiconductor substrate;
a first common-gated dual-thickness dielectric MOSFET, comprising:
a first protective device comprising a first gate dielectric having a first thickness and formed over a first channel region,
a first MOSFET comprising a second gate dielectric thicker than the first gate dielectric and formed over a second channel region, and
a first common gate electrode serving as a gate electrode of the first protective device and as a gate electrode of the first MOSFET; and
second common-gated dual-thickness dielectric MOSFET, comprising:
a second protective device comprising a third gate dielectric having a third thickness and formed over a third channel region,
a second MOSFET comprising a fourth gate dielectric thicker than the third gate dielectric and formed over a fourth channel region, and
a second common gate electrode serving as a gate electrode of the second protective device and as a gate electrode of the second MOSFET.

17. The integrated circuit device of claim 16, wherein the second common-gated dual-thickness dielectric MOSFET has substantially the same dimensions as the first common-gated dual-thickness dielectric MOSFET.

18. The integrated circuit device of claim 16, wherein the first MOSFET and the second MOSFET share a common drain.

19. An integrated circuit device comprising:
a semiconductor substrate;
a first device region and a second device region formed on the semiconductor substrate;
a gate dielectric layer formed over the second device region; and
a common electrode formed over the first and second device regions, the common electrode serving as a transistor gate electrode over the gate dielectric in the second device region, and the first device region providing a discharge path from the common electrode to the substrate, the discharge path having a lower resistance than a tunnel path through the gate dielectric layer over the second device region,
wherein the first device region is configured to protect the second device region during fabrication of the second device region and is not configured as a final functional device.

20. The integrated circuit device of claim 19, further comprising a well region in the first device region, wherein the common electrode is in direct contact with the substrate in the first device region.

21. The integrated circuit device of claim 19, wherein the common electrode, the gate dielectric layer, and the substrate are configured to form a tunnel bather capacitor.

22. The integrated circuit device of claim 20, wherein the substrate comprises an n-type well region forming an N-side of a first PN diode and the common electrode is a heavily doped p-type common electrode forming a P-side of the first $P^+N$ diode.

23. The integrated circuit device of claim 22, wherein the semiconductor is a p-type substrate forming a P-side of a second PN diode and the well region forms an N-side of the second PN diode.

24. The integrated circuit device of claim 19, further including a tunnel dielectric formed over the first device region between the common electrode and the substrate, wherein the tunnel dielectric is thinner than the gate dielectric layer.

25. The integrated circuit device of claim 19, wherein the substrate comprises an n-type well region and the common electrode is a metal, wherein the n-type well region and the common electrode form a Schottky diode.

26. A method of forming an integrated circuit device comprising a common-gated dual-oxide MOSFET, comprising:
- providing a semiconductor substrate;
- forming a first gate dielectric having a first thickness over a first channel region;
- forming a second gate dielectric thicker than the first gate dielectric over a second channel region;
- depositing a common gate electrode layer and masking the gate electrode layer;
- plasma etching the masked gate electrode layer to form a common gate electrode over the first and second channel regions; and
- conducting a first current through the first gate dielectric and a second current through the second gate dielectric during plasma etching, the first current being higher than the second current in absolute value.

27. The method of claim 26, wherein conducting includes tunneling electrons between the masked gate electrode layer and the substrate.

28. The method of claim 26, wherein forming the first gate dielectric and forming the second gate dielectric comprises providing a ratio of thickness of the second gate dielectric to a thickness of the first gate dielectric between about 1.5 and 2.0.

29. The method of claim 26, further including forming an oxide isolation between the first and second gate dielectrics.

* * * * *

UNITED STATES PATENT AND TRADEMARK OFFICE
CERTIFICATE OF CORRECTION

PATENT NO. : 8,912,582 B2
APPLICATION NO. : 13/801928
DATED : December 16, 2014
INVENTOR(S) : Mark D. Reisiger It is certified that error appears in the above-identified patent and that said Letters Patent is hereby corrected as shown below:

In the Specification

In column 3 at line 23 (approx.), Change "(ME)," to --(RIE),--.

In column 3 at line 23 (approx.), Change "ME," to --RIE,--.

In column 3 at line 28 (approx.), Change "ME," to --RIE,--.

In column 5 at line 9, Change "Vg" to --$V_g$--.

In column 9 at line 3, Change "a a" to --a--.

In column 10 at line 10, Change "Vg" to --$V_g$--.

In column 10 at line 19, Change "Vg" to --$V_g$--.

In column 12 at line 3, Change "Vg," to --$V_g$,--.

In column 12 at line 27, Change "Vg" to --$V_g$--.

In column 12 at line 34, Change "Vg" to --$V_g$--.

In column 12 at line 41, Change "Vg" to --$V_g$--.

In column 14 at line 23, Change "Vg" to --$V_g$--.

In column 15 at line 6, Change "Tdiel" to --$T_{diel}$--.

In column 15 at line 6, Change "Vg" to --$V_g$--.

In column 18 at line 6, Change "$E_2$" to --$E_{C2}$--.

In column 18 at line 64, Change "$O_{B2}$" to --$\Phi_{B2}$--.

In column 20 at line 26, Change "a a" to --a--.

In the Claims

In column 24 at line 7, In Claim 16, before "second" insert --a--.

In column 24 at line 49, In Claim 21, change "bather" to --barrier--.

Signed and Sealed this
Twenty-third Day of February, 2016

Michelle K. Lee
*Director of the United States Patent and Trademark Office*